United States Patent
Taylor

(10) Patent No.: US 9,188,798 B2
(45) Date of Patent: Nov. 17, 2015

(54) OPTICAL CLOSED LOOP MICRORESONATOR AND THYRISTOR MEMORY DEVICE

(75) Inventor: Geoff W. Taylor, Mansfield, CT (US)

(73) Assignees: Opel Solar, Inc., Storrs Mansfield, CT (US); The University of Connecticut, Farmington, CT (US)

(*) Notice: Subject to any disclaimer, the term of this patent is extended or adjusted under 35 U.S.C. 154(b) by 0 days.

(21) Appl. No.: 14/238,649

(22) PCT Filed: Aug. 17, 2012

(86) PCT No.: PCT/US2012/051265
§ 371 (c)(1),
(2), (4) Date: Feb. 12, 2014

(87) PCT Pub. No.: WO2013/025964
PCT Pub. Date: Feb. 21, 2013

(65) Prior Publication Data
US 2014/0241660 A1      Aug. 28, 2014

Related U.S. Application Data

(60) Provisional application No. 61/525,072, filed on Aug. 18, 2011.

(51) Int. Cl.
G02F 1/035      (2006.01)
G02F 1/017      (2006.01)
G02B 6/12       (2006.01)
G02B 6/293      (2006.01)
G02B 6/124      (2006.01)
G02B 6/125      (2006.01)

(Continued)

(52) U.S. Cl.
CPC ............ G02F 1/01708 (2013.01); G02B 6/124 (2013.01); G02B 6/125 (2013.01); G02B 6/12007 (2013.01); G02B 6/29338 (2013.01); H01L 45/06 (2013.01); B82Y 20/00 (2013.01); G02F 2001/0154 (2013.01); Y10S 977/755 (2013.01)

(58) Field of Classification Search
CPC ..... G02F 1/01708; H01L 45/06; G02B 6/124; G02B 6/125; G02B 6/29338; G02B 6/12007
See application file for complete search history.

(56) References Cited

U.S. PATENT DOCUMENTS 5,790,583 A    8/1998   Ho
6,031,243 A    2/2000   Tayor (Continued)

FOREIGN PATENT DOCUMENTS

WO    WO 02/071490 A1    9/2002

OTHER PUBLICATIONS

Design of Micro Resonator Quantum Well Intensity Modulators Based on an Absorption Blue-Shift; Y. Zhang et al., Dept. of ECE, Univ. of Conn., Aug. 2011.

(Continued)

*Primary Examiner* — Ryan Lepisto
(74) *Attorney, Agent, or Firm* — Gordon & Jacobson P.C.

(57) ABSTRACT

A monolithic semiconductor device that includes a waveguide structure optically coupled to an optical resonator. The optical resonator is adapted to process light at a predetermined wavelength. The optical resonator includes a closed loop waveguide having a plurality of straight sections that are optically coupled together by bend sections.

32 Claims, 32 Drawing Sheets

(51) Int. Cl.
*H01L 45/00* (2006.01)
*B82Y 20/00* (2011.01)
*G02F 1/015* (2006.01)

(56) References Cited

U.S. PATENT DOCUMENTS

| | | | |
|---|---|---|---|
| 6,118,908 | A | 9/2000 | Bischel et al. |
| 6,275,296 | B1 * | 8/2001 | Numai ............................ 356/459 |
| 6,479,844 | B2 | 11/2002 | Taylor |
| 6,639,930 | B2 * | 10/2003 | Griffel et al. ..................... 372/94 |
| 6,841,795 | B2 | 1/2005 | Taylor et al. |
| 6,849,866 | B2 | 2/2005 | Taylor |
| 6,853,014 | B2 | 2/2005 | Taylor et al. |
| 6,865,314 | B1 | 3/2005 | Blair et al. |
| 6,870,207 | B2 | 3/2005 | Taylor |
| 6,873,273 | B2 | 3/2005 | Taylor et al. |
| 6,954,473 | B2 | 10/2005 | Dehmubed et al. |
| 6,995,407 | B2 | 2/2006 | Taylor et al. |
| 7,332,752 | B2 | 2/2008 | Taylor et al. |
| 7,657,132 | B1 | 2/2010 | Yap et al. |
| 7,713,803 | B2 * | 5/2010 | Jin et al. ......................... 438/172 |
| 7,750,763 | B2 | 7/2010 | Prabmayer |
| 2002/0176087 | A1 | 11/2002 | Numai |
| 2004/0081467 | A1 * | 4/2004 | Taylor et al. ................... 398/161 |
| 2004/0188669 | A1 * | 9/2004 | Atanackovic et al. .......... 257/15 |
| 2009/0190875 | A1 | 7/2009 | Bratkovski et al. |
| 2009/0239323 | A1 | 9/2009 | Tan et al. |

OTHER PUBLICATIONS

Micro-Optical Resonators for Microlasers and Integrated Optoelectronics, Trevor M. Benson et al., George Green Institute for Electromagnetics Research, 2006.
Resonant Optoelectronic Thyristor Switches as Elements for Optical Switching Fabrics, P. C. Pile et al., Dept. of ECE, Univ. of Conn., Aug. 23, 2011.
Planar Corner-Cut Square Microcavities: Ray Optics and FDTD Analysis; Chung Yan Fong et al., Optics Express, Oct. 4, 2004, vol. 12, No. 20.
Transistor Based Quantum Well Optical Modulator and Its Performance in RF Links, Y.Zhang et al., Proc. SPIE 7817, 12-22 (2010).
U.S. Appl. No. 08/949,504, filed Oct. 14, 1997, Geoff W. Taylor.
U.S. Appl. No. 09/710,217, filed Nov. 10, 2000, Geoff W. Taylor.
U.S. Appl. No. 60/376,238, filed Apr. 26, 2002, Geoff W. Taylor.

* cited by examiner

FIG. 24

Operations

- Write '1' : Electrical (or Optical)
- Write '0' : Electrical
- Read : Electrical (or Optical)
- NV Store ('1') : Electrical
- NV Erase ('0') : Electrical

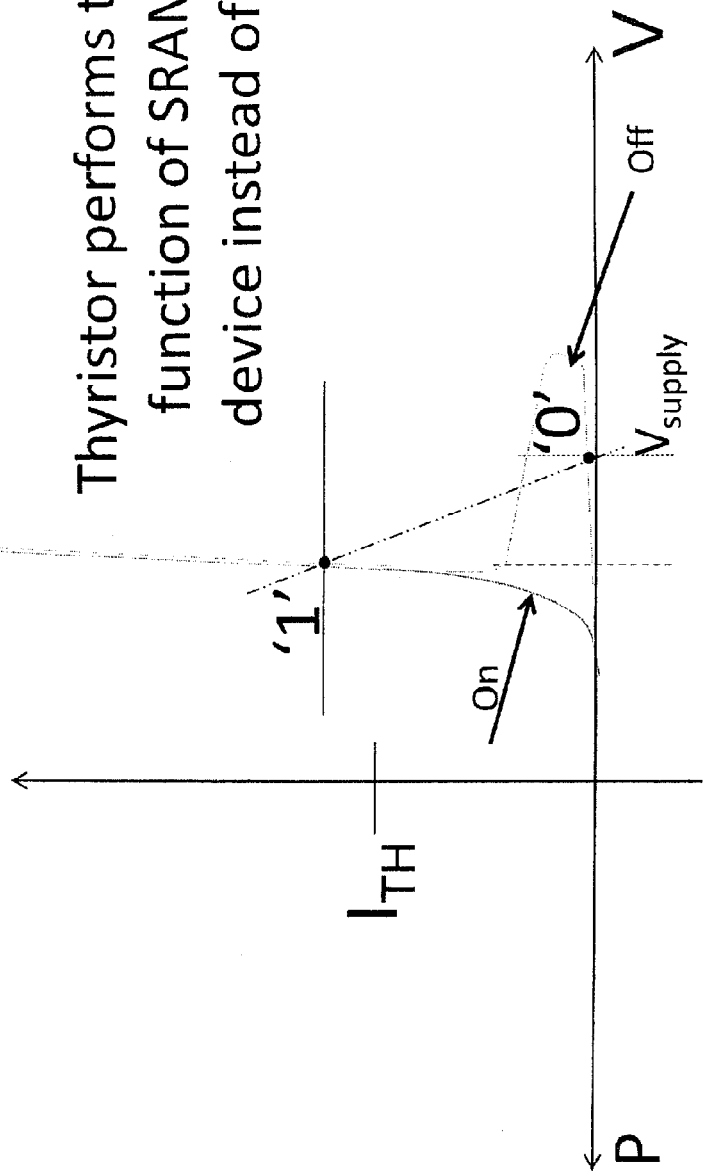
FIG. 27    Static RAM Operation

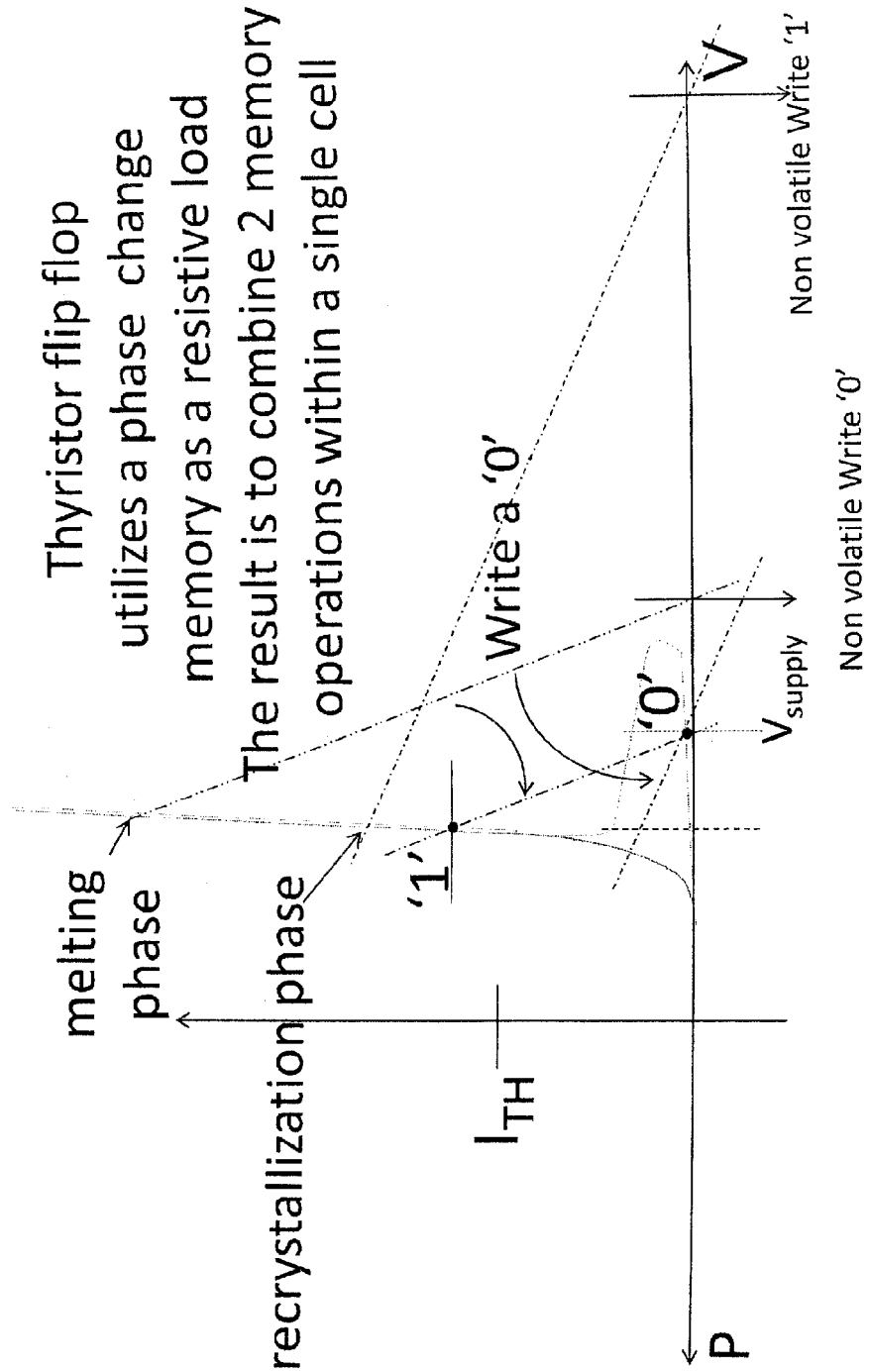
FIG. 2θ  NV RAM Operation

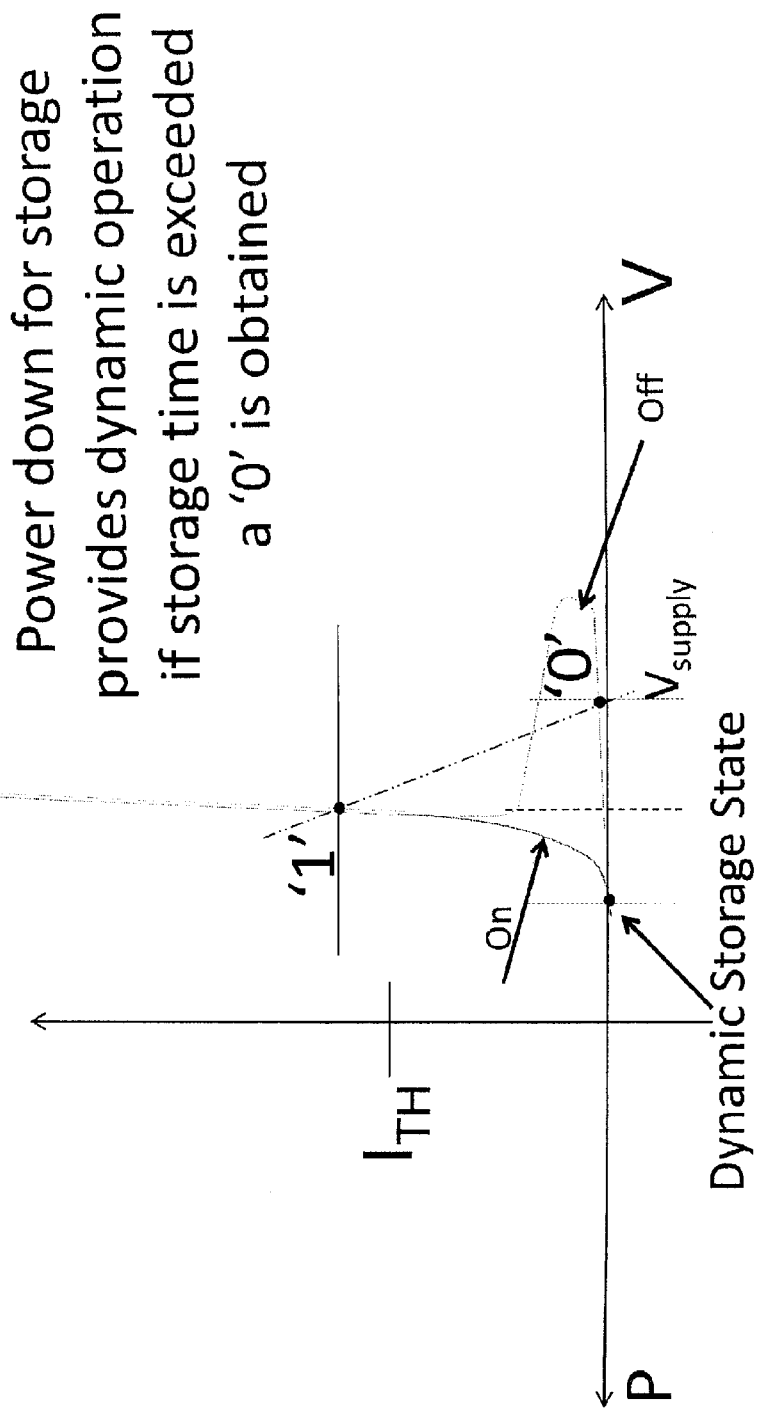
FIG. 29 Dynamic RAM Operation

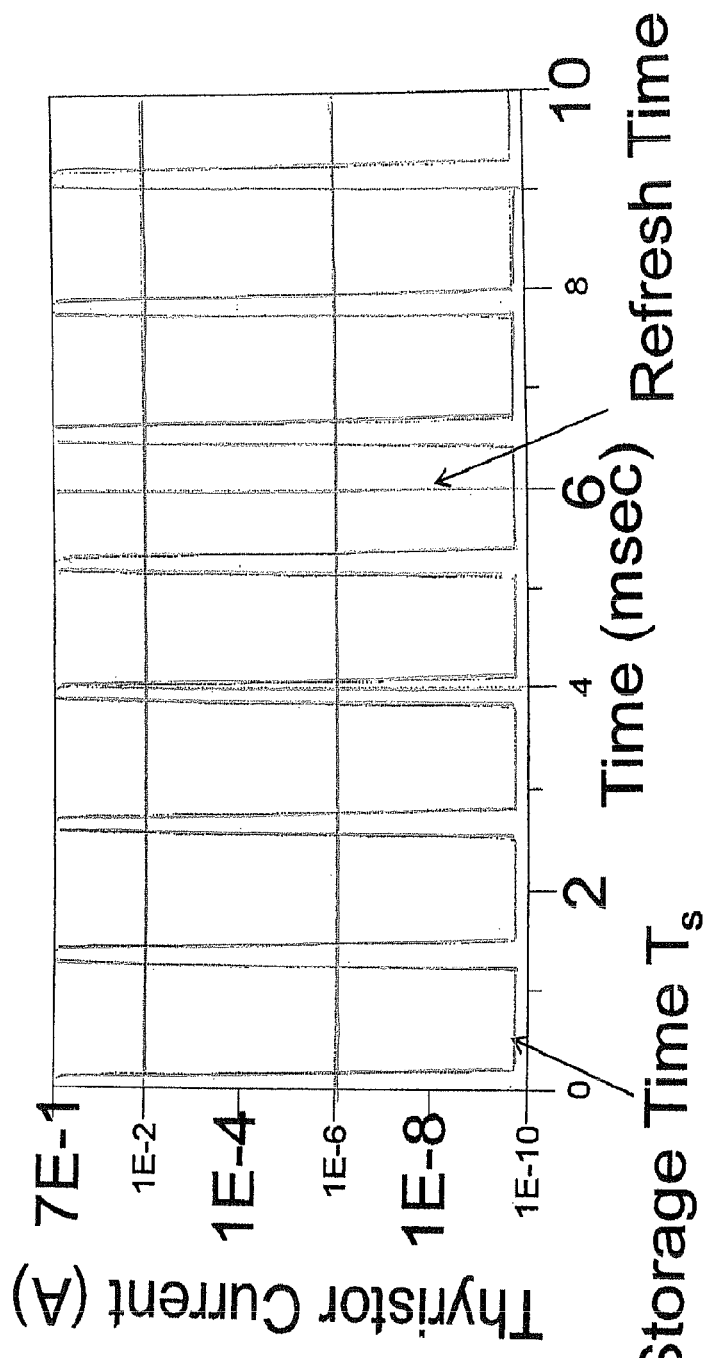
FIG. 30  STORAGE FUNCTION IN THE THYRISTOR MEMORY OPERATION

FIG. 31

Thyristor Memory Cell: Universal Memory Element

- A minimum size cell (crosspoint of an array) performs all memory functions → SRAM, DRAM or NV
- Mode of operation may be alternated between DRAM and SRAM to trade off speed for power
- NV operation can be enabled at any time, e.g. a decreasing power supply voltage could activate the NV write operation so that all data is captured
- Optoelectronic operation is utilized for specific applications such as photonic buffer memories
- Scaling superiority: thyristor/HFETs scale to <20nm nodes much more easily than CMOS because oxide scaling is eliminated
- Full compatibility with full spectrum of optical and optoelectronic circuit functions
- Advantage over Memristor  a) only 1 polarity of voltage required
   b) optoelectronic compatible

OPTICAL CLOSED LOOP MICRORESONATOR AND THYRISTOR MEMORY DEVICE

BACKGROUND OF THE INVENTION

Optical ring resonator structures have been developed for optical modulation functions. Most of the proposed (and all of the demonstrated) optical ring resonator modulators are based on silicon-on-insulator (SOI) waveguides using silicon oxide cladding layers. The modulation relies on refractive index changes produced by the absorption of light in the intrinsic region of a p-i-n structure. Since the energy of the light at 1550 nm is less than the energy gap of the Si, then bandgap absorption is not allowed and the absorption must be enabled by the injection of both holes and electrons into the intrinsic region to create free carrier absorption.

One obvious drawback of these configurations is power consumption since relatively high voltages and current are required (the absorption is proportional to the current). Other drawbacks are the low values of absorption for a given current flow and the problem of removing the injected charge when the signal is reduced to zero.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

The detailed description describes a monolithic semiconductor device that includes a waveguide structure optically coupled to an optical resonator. The optical resonator is adapted to process light at a predetermined wavelength. The optical resonator includes a closed loop waveguide having a plurality of straight sections that are optically coupled together by bend sections. The closed loop waveguide defines a central region surrounded by the closed loop waveguide. The waveguide structure includes a plurality of sections extending between an input and an output. One of the sections of the waveguide structure is spaced from and extends parallel to one straight section of the closed loop waveguide of the optical resonator to provide for evanescent-wave optical coupling therebetween. Both the optical resonator and the waveguide structure are formed in an epitaxial layer structure deposited on a substrate. The epitaxial layer structure includes at least one modulation doped quantum well interface. The central region of the optical resonator includes at least one ion implant that extends through the at least one modulation doped quantum well interface of the epitaxial layer structure. The at least one ion implant provides for lateral confinement of light within the closed loop waveguide. The at least one ion implant can also provide for funneling of DC current away from the central region and through the closed loop waveguide of the optical resonator.

The monolithic semiconductor device can be configured for a variety of functions, such as an optical modulator, in-plane laser, optical detector, and cross-point switching device as part of an optical switching fabric.

In one embodiment, the epitaxial layer structure includes complementary (both an n-type and a p-type) modulation doped quantum well interfaces formed between an n-type region and a p-type region to realize a thyristor structure.

In another embodiment, the closed loop waveguide is rectangular in nature with four straight sections coupled by ninety degree bends. Each ninety degree bend can include an outside facet and a cut inside corner that extends parallel to the outside facet, wherein the outside facet is defined a sidewall in the epitaxial layer structure and the cut inside corner is defined by the profile of the at least one ion implant. The waveguide structure can include a zig-zag structure with five straight sections coupled by ninety degree bends.

BRIEF DESCRIPTION OF THE DRAWINGS

FIG. 24 is a diagram summarizing the operations of the thyristor memory cell of FIG. 23.

FIG. 27 is an exemplary IV curve illustrating the static RAM operations of the thyristor memory cell of FIG. 23.

FIG. 28 is an exemplary IV curve illustrating the non-volatile RAM operations of the thyristor memory cell of FIG. 23.

FIG. 29 is an exemplary IV curve illustrating the dynamic RAM operations of the thyristor memory cell of FIG. 23.

FIG. 30 is an exemplary diagram of storage function of the thyristor memory cell of FIG. 23 for dynamic RAM operations.

FIG. 31 is a diagram summarizing the benefits of the thyristor memory cell of FIG. 23.

DETAILED DESCRIPTION OF ILLUSTRATIVE EMBODIMENTS

Figure 1:
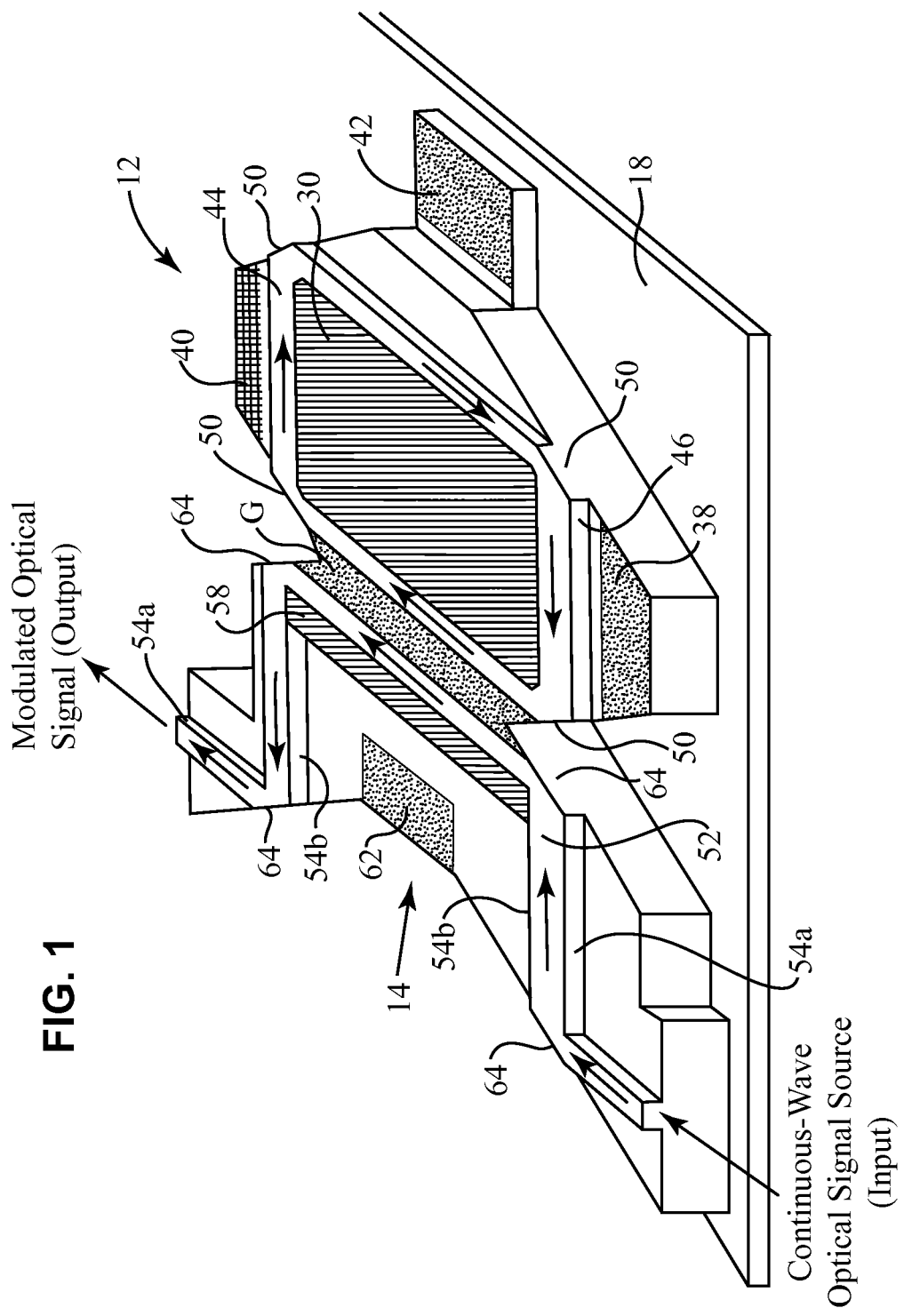
FIG. 1 is a schematic perspective view of a monolithic optoelectronic device in accordance with the present invention; the monolithic optoelectronic device includes a zig-zag waveguide structure that is optically coupled by evanescent-wave coupling to a rectangular closed loop waveguide of a thyristor microresonator.

The present application builds upon Planar Optoelectronic Technology (POET) that provides for the realization of a variety of devices (optoelectronic devices, logic circuits and/or signal processing circuits) utilizing inversion quantum-well channel device structures as described in detail in U.S. Pat. No. 6,031,243; U.S. patent application Ser. No. 09/556,285, filed on Apr. 24, 2000; U.S. patent application Ser. No. 09/798,316, filed on Mar. 2, 2001; International Application No. PCT/US02/06802 filed on Mar. 4, 2002; U.S. patent application Ser. No. 08/949,504, filed on Oct. 14, 1997, U.S. patent application Ser. No. 10/200,967, filed on Jul. 23, 2002; U.S. application Ser. No. 09/710,217, filed on Nov. 10, 2000; U.S. Patent Application No. 60/376,238, filed on Apr. 26, 2002; U.S. patent application Ser. No. 10/323,390, filed on Dec. 19, 2002; U.S. patent application Ser. No. 10/280,892, filed on Oct. 25, 2002; U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002; U.S. patent application Ser. No. 10/323,388, filed on Dec. 19, 2002; U.S. patent application Ser. No. 10/340,942, filed on Jan. 13, 2003; all of which are hereby incorporated by reference in their entireties. These device structures are built from an epitaxial layer structure and associated fabrication sequence that can be used to make the devices on a common substrate. In other words, n type and p type contacts, critical etches, etc. can be used to realize one or more of the devices simultaneously on a common substrate. Features of the epitaxial structure include 1) a bottom n-type layer structure, 2) a top p-type layer structure, and 3) an n-type modulation doped quantum well interface and a p-type modulation doped quantum well interface disposed between the bottom n-type layer structure and the top p-type layer structure. N-type and p-type ion implants are used to contact the n-type and p-type modulation doped quantum well interfaces, respectively. N-type metal contacts to the n-type ion implants and the bottom n-type layer structure. P-type metal contacts to the p-type ion implants and the top p-type layer structure. The epitaxial layer structure can be realized with a material system of group III-V materials (such as a GaAs/AlGaAs). The n-type modulation doped quantum well interface includes a relatively thin layer of highly doped n-type material (referred to herein as an "n+ charge sheet") spaced from one or more quantum wells by an undoped spacer layer. The p-type modulation doped quantum well interface includes a relatively thin layer of highly doped p-type material (referred to herein as a "p+ charge sheet") spaced from one or more quantum wells by an undoped spacer layer. The n+ charge sheet is disposed above the quantum well(s) of the n-type modulation doped quantum well interface adjacent the top p-type layer structure. The p+ charge sheet is disposed below the quantum well(s) of the p-type modulation doped quantum well interface adjacent the bottom n-type layer structure. One or more spacer layers are disposed between the quantum well(s) of the n-type modulation doped quantum well interface and the one or more quantum well(s) of the p-type modulation doped quantum well interface. A bottom dielectric distributed Bragg reflector (DBR) mirror can be formed below the bottom n-type layer structure. The bottom DBR mirror can be formed from alternating layers of AlAs and GaAs. The AlAs layers are subjected to high temperature steam oxidation to produce the compound $Al_xO_y$ so as to form the bottom DBR mirror. A top dielectric mirror can be formed above the top p-type layer structure. The top dielectric mirror can be formed from alternating layers of $SiO_2$ and a high refractive index material such as silicon or titanium dioxide ($TiO_2$). The bottom and top mirrors provide for vertical confinement of light. The top dielectric mirror can cover the sidewalls of the device structure to provide for lateral confinement of light as needed.

POET can be used to construct a variety of high performance transistor devices, such as complementary NHFET and PHFET unipolar devices as well as n-type and p-type HBT bipolar devices. POET can also be used to construct a variety of optoelectronic devices which include:
 a thyristor VCSEL laser;
 an NHFET laser;
 an PHFET laser;
 a thyristor optical detector;
 an NHFET optical detector;

an PHFET optical detector;
a semiconductor optical amplifier (SOA) or a linear optical amplifier (LOA) based on either one (or both) of the n-type and p-type quantum well interfaces;
an absorption (intensity) optical modulators based on either one (or both) of the n-type and p-type quantum well interfaces;
a phase modulator based on either one (or both) of the n-type and p-type quantum well interfaces;
a waveguide switch; and
a passive waveguide.

The present invention extends the POET device structure to allow for the construction of a monolithic optoelectronic device including a thyristor microresonator 12 that is spaced from a section of a zig-zag waveguide structure 14 by a gap region G. The zig-zag waveguide structure 14 is optically coupled to the thyristor microresonator 12 by evanescent-wave coupling over the gap region G as will be described in detail below.

Figure 3:
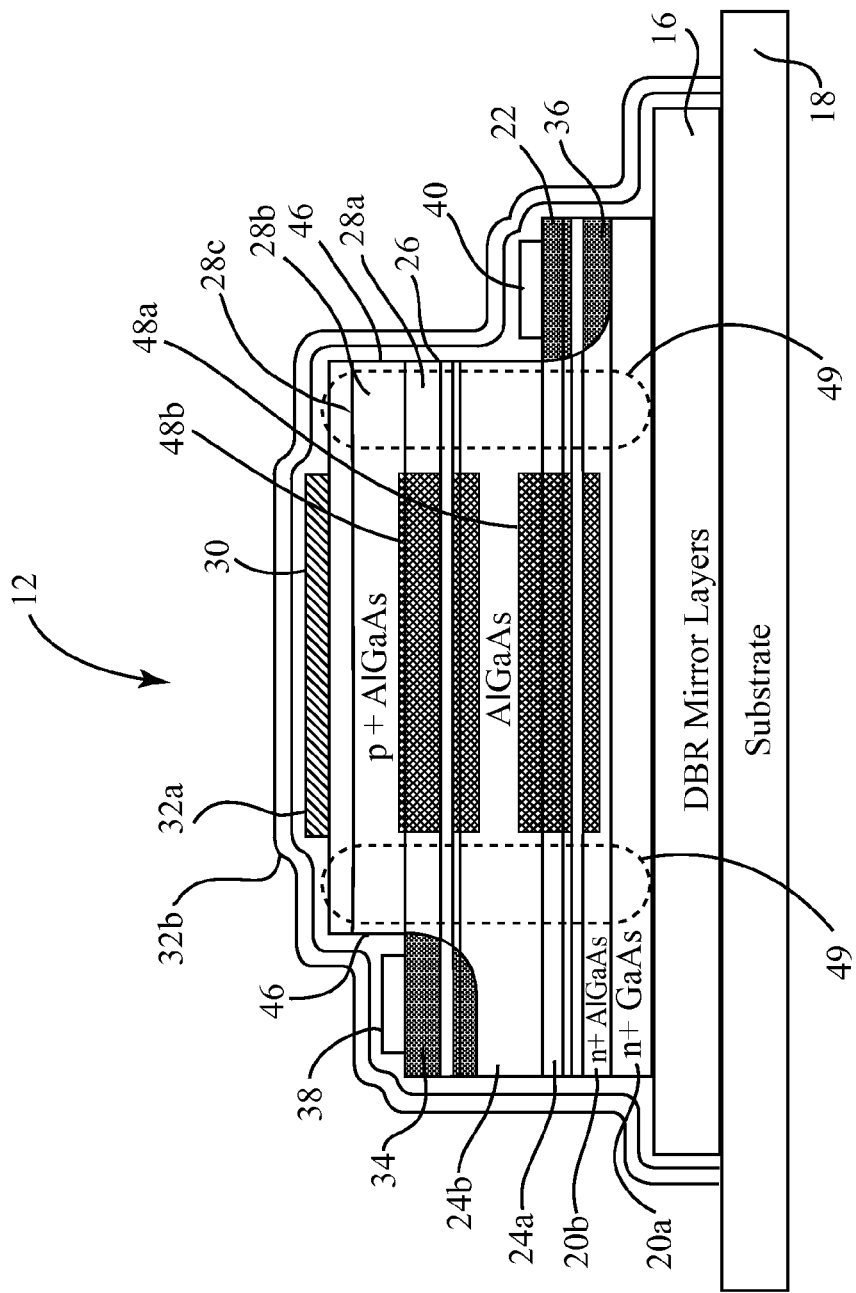
FIGS. 3 and 4 are schematic cross-sectional views through sections A-A and B-B, respectively, of FIG. 2, illustrating the exemplary device structure for realizing the thyristor microresonator and the zig-zag waveguide structure of the monolithic optoelectronic device of FIG. 1.
Figure 4:
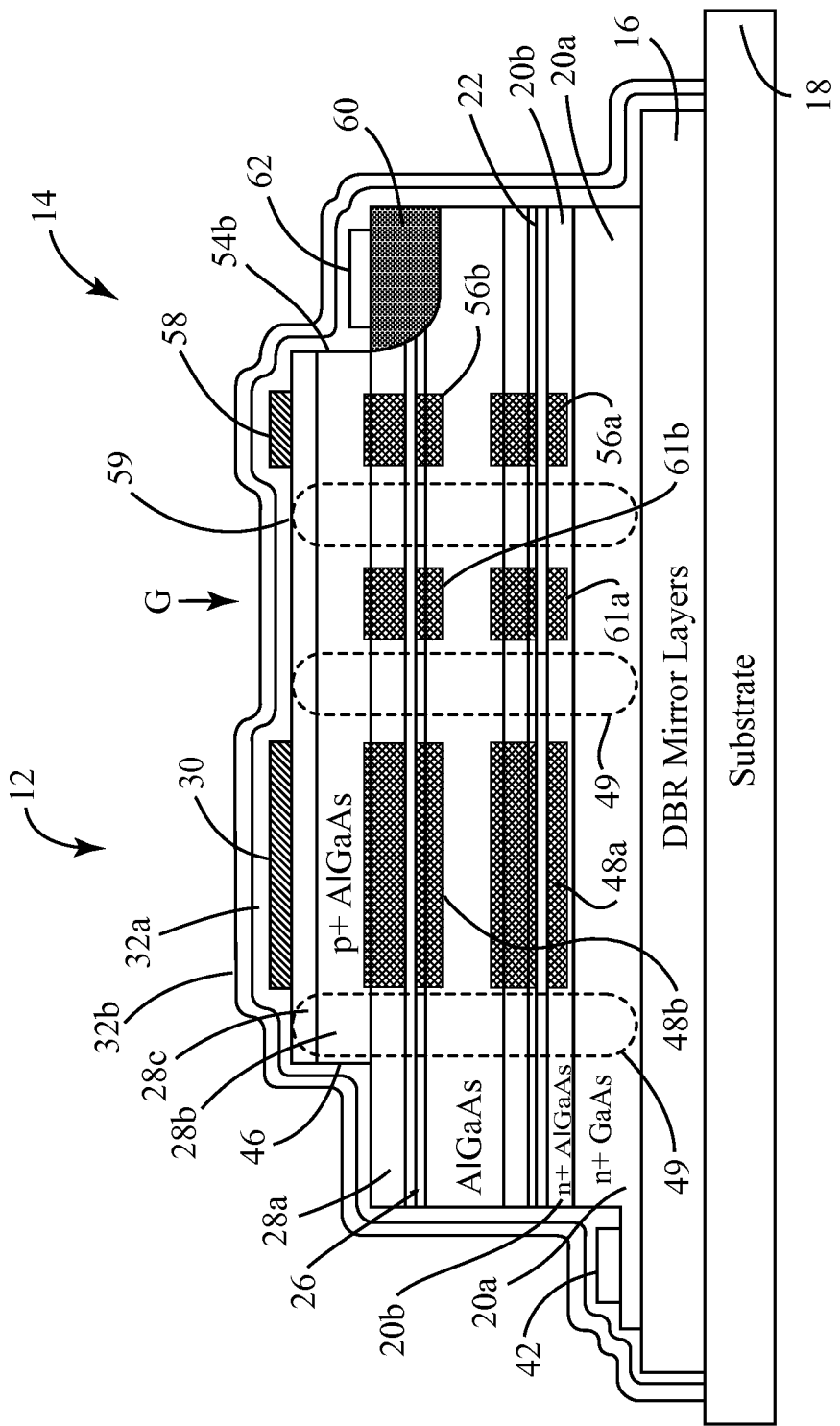

In an exemplary embodiment, the thyristor microresonator 12 is realized from an active device structure that includes a bottom DBR mirror 16 formed on a substrate 18 (such as a GaAs wafer) as best shown in the cross-sections of FIGS. 3 and 4. A bottom n-type layer structure 20 (such as a layer 20a of n+ GaAs and a layer 20b of n+AlGaAs) is formed above the DBR mirror 16. The bottom DBR mirror 16 can be formed from alternating layers of AlAs and GaAs. The AlAs layers are subjected to high temperature steam oxidation to produce the compound $Al_xO_y$ so as to form the bottom DBR mirror 16. A p-type modulation doped quantum well interface 22 is formed above the n-type layer structure. The p-type modulation doped quantum well interface 22 includes a p+ charge sheet spaced from one or more quantum wells by an undoped spacer layer. The p+ charge sheet is disposed below the quantum well(s) of the p-type modulation doped quantum well interface 22 adjacent the bottom n-type layer structure 20. One or more undoped spacer layers (such as layers 24a and undoped AlGaAs layer 24b) are formed above the p-type modulation doped quantum well interface 22. An n-type modulation doped quantum well interface 26 is formed above the undoped spacer layer(s) 24. The n-type modulation doped quantum well interface 26 includes an n+ charge sheet spaced from one or more quantum wells by an undoped spacer layer. A top p-type layer structure 28 (such as layers 28a, 28b of P+ AlGaAs, and 28c) is formed above the n-type quantum well interface 26. The n+ charge sheet is disposed above the quantum well(s) of the n-type modulation doped quantum well interface adjacent the top p-type layer structure 28. A refractory p-type anode electrode 30 is formed on the top p-type layer structure 28. A top dielectric mirror 32 is formed above the top p-type layer structure 28 and the refractory anode 30. The top dielectric mirror 32 can be formed from alternating layers 32a, 32b of $SiO_2$ and a high refractive index material such as silicon. The top dielectric mirror 32 can cover the sidewalls of the device structure as shown to provide for lateral confinement of light as needed. An n-type ion implant 34 into a mesa above the n-type modulation doped quantum well interface 26 is used to contact the n-type modulation doped quantum well interface 26. A p-type ion implant 36 into a mesa above the p-type modulation doped quantum well interface 22 is used to contact the p-type modulation doped quantum well interface 22. N-type metal 38 contacts to the n-type ion implant 34 to form an n-channel injector electrode that is electrically coupled to the n-type modulation doped quantum well interface 26. P-type metal 40 contacts to the p-type ion implants 36 to form an n-channel injector electrode that is electrically coupled to the p-type modulation doped quantum well interface 22. N-type metal 42 is deposited on a mesa formed in the bottom n-type layer structure 20 (such as the bottom layer 20a) to form a cathode electrode of the device.

Details of exemplary epitaxial layers and fabrication methodology to realize the device structure of the thyristor microresonator 12 are described in POET patents as incorporated by reference above.

Figure 2:
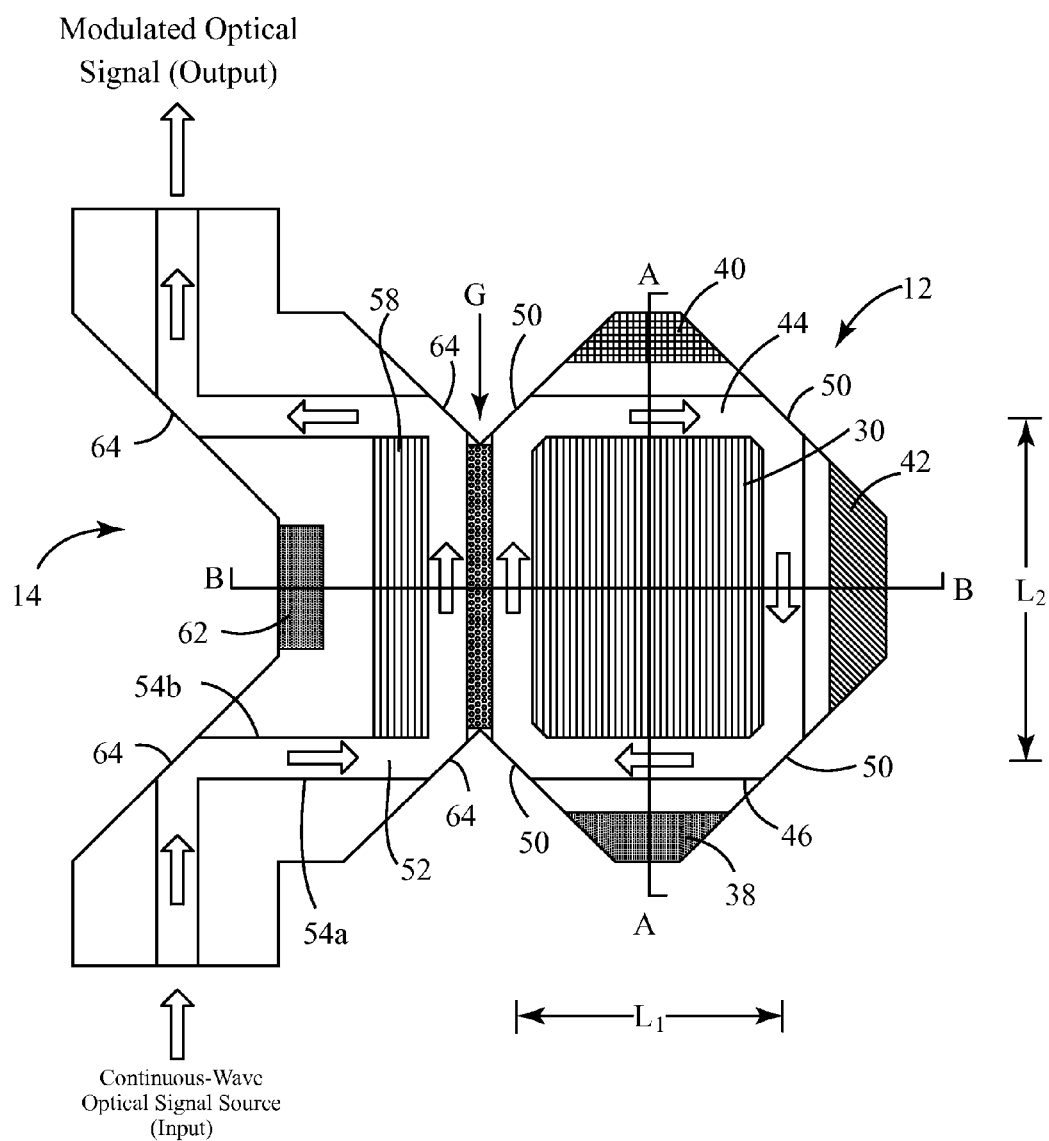
FIG. 2 is a schematic top view of the monolithic optoelectronic device of FIG. 1.

As best shown in FIGS. 1 and 2, the thyristor microresonator 12 defines a waveguide 44 that follows a closed path that is generally rectangular in shape. The optical mode circulates around the waveguide 44 and is strongly confined within the waveguide 44 by internal reflection at the reflective interfaces of the waveguide 44. More specifically, vertical confinement of the optical mode in the waveguide 44 is provided by the bottom DBR mirror 16 and the top dielectric mirror 32 (layers 32a, 32b) as shown in the cross-sections of FIGS. 3 and 4. Lateral confinement of the optical mode in the waveguide 44 is provided by a refractive index change at the sidewalls 46 that define the outer boundary of the waveguide 44 (FIGS. 1, 2, 3 and 4) and by refractive index change at the periphery of the implant regions 48a, 48b under the top anode electrode 30 (FIGS. 3 and 4). Lateral confinement of the optical mode in the waveguide 44 can also be aided by the top dielectric mirror 32 that covers the sidewalls 46 as shown. The central implant regions 48a, 48b are of suitable n+ material and can be formed by localized implantation of a suitable n+ species (such as silicon fluoride ions) into the device structure prior to deposition and patterning of the top refractory p-type anode electrode 30. The perimeters of the central implant regions 48a, 48b are generally rectangular in shape and define the inner reflective surface of the waveguide 44. The depths of the central implant regions 48a, 48b (which is controlled by the power level during implantation) encompass the n-type and p-type modulation doped quantum well interfaces 22 and 26, respectively. The central implant regions 48a and 48b act as a barrier to current flow so as to funnel current flowing between the anode electrode 30 and the cathode electrode 40 into the active region (show as dotted line 49) of the waveguide 44 and away from the central region of the device below the top anode electrode 30. The operation of the thyristor microresonator 12 relies on electrical signals supplied to the electrodes of the device (e.g., the top anode electrode 30, the n-channel injector electrode 38, the p-channel injector electrode 40, and the bottom cathode electrode 42) as is described below in detail.

The length of the closed path waveguide 44 is tuned to the particular wavelength of the optical mode that is to propagate in the waveguide 44. More specifically, the length of the rectangular closed path waveguide 44 is given as $2(L_1+L_2)$ for the $L_1$ and $L_2$ length parameters of the waveguide 44 as best shown in FIG. 2. In this configuration, the $L_1$ and $L_2$ parameters are selected to conform to the following:

$$2(L_1 + L_2) = \frac{2\pi m\lambda}{n_{\mathit{eff}}} \qquad (1)$$

where $L_1$ and $L_2$ are the effective lengths of the opposed sides of the closed path waveguide 44;
m is an integer greater than zero;
λ is the wavelength of the optical mode that is to propagate in the waveguide 44; and
$n_{\mathit{eff}}$ is the effective refractive index of the waveguide 44.
The width (W) of the closed path waveguide 44 can be less than 2 μm, and possibly 1 μm or less. The width of the gap region G (i.e., the spacing between the waveguide 44 and the waveguide structure 14) can be less than 2 µm, and possibly on the order of 1 µm.

Figure 5A:
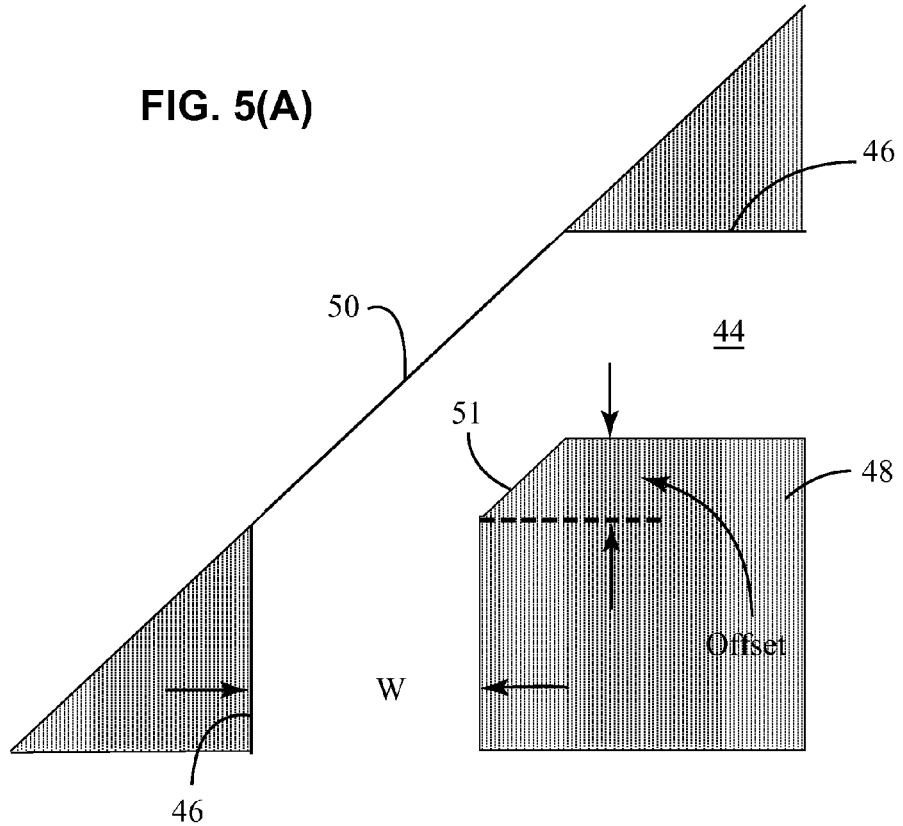
FIG. 5(A) is a schematic top view of a 90 degree bend of the rectangular closed path waveguide of the thyristor microresonator of FIG. 1.

The rectangular closed path waveguide 44 of the thyristor microresonator 12 is formed by four ninety degree bends. As best shown in FIGS. 1, 2 and 5(A), each ninety degree bend is defined by a respective forty-five degree facet 50 formed in the outer sidewall 46 of the waveguide 44. The rectangular waveguide 44 has several advantages, including but not limited to: 1) it allows for the four separate contacts to the electrodes of the thyristor device structure; 2) it allows the width of the waveguide 44 to be greater than the resonant wavelength, and thus reduces the dimensional tolerances and associated manufacturing complexities required for smaller resonance wavelengths (such as wavelengths at or near 1 µm); 3) it allows for effective control over the width of the waveguide 44 as well as the gap width between the waveguide 44 and the waveguide structure 14—these two parameters influence the Q factor of the thyristor microresonator 12 and the efficiency of the evanescent-wave coupling between the two waveguides; and 4) it provides a high packing density in laying out the structures on the substrate.

Figure 5B:
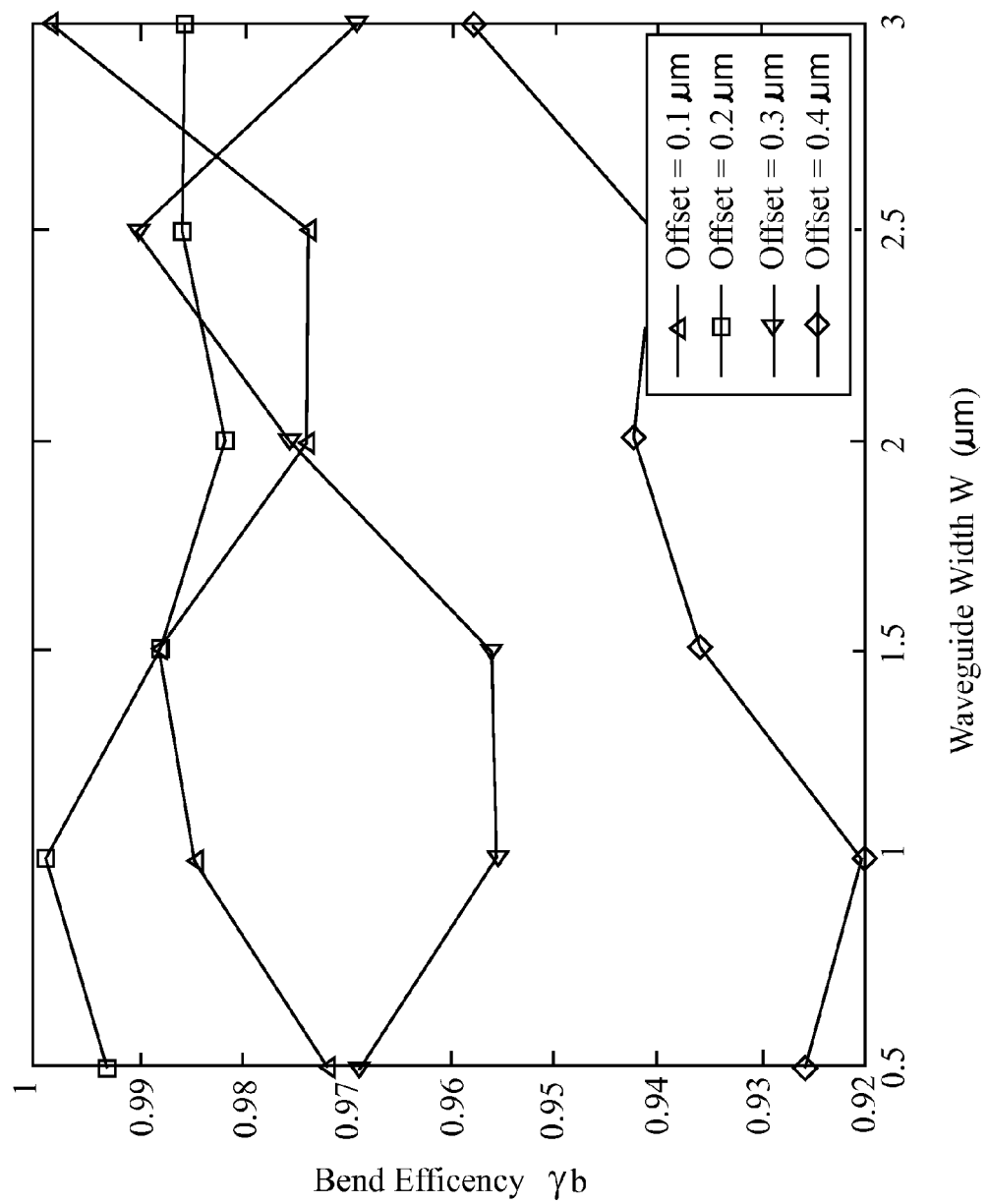
FIG. 5(B) is an exemplary graph illustrating the variation in bend efficiency as a function of offset of the 90 degree bend of FIG. 5(A).

In one embodiment as best shown in FIG. 5(A), the inside corner of each respective ninety degree bend of the rectangular waveguide 44 is cut (or blunted) by a facet 51 that is oriented substantially parallel to the four-five degree facet 50 of the respective bend. The cut inside corner of each respective ninety degree bend improves the bend efficiency, which provides for improved resonance of the optical mode traveling wave propagating around the rectangular waveguide 44. The length and position of the cut inside corner (facet 51) relative to the four-five degree facet 50 of the respective bend can be characterized by an offset parameter as shown in FIG. 5(A). The offset parameter of the cut inside corner (and thus the length and position of the cut inside corner (facet 51) relative to the four-five degree facet 50) can be varied by design and can affect the bend efficiency of the ninety degree bends as a function of width of the waveguide 44 as shown in FIG. 5(B). Bend efficiency is the ratio of the optical power in the waveguide after bend relative to optical power incident on the bend. In this illustrative embodiment, an offset parameter of 0.2 µm is best used for a rectangular waveguide 44 of a width of 2 µm or less, while other offset parameters can be used for other widths. The cut inside corners (facet 51) are defined by the profile of the central implant regions 48a, 48b, which is dictated by the mask used for the ion implantation that forms the central implant regions 48a, 48b.

As best shown in FIGS. 1, 2 and 4, the waveguide structure 14 defines a rib waveguide 52 that forms a zig-zag path. The optical mode is strongly confined within the waveguide 52 by internal reflection at the reflective interfaces of the waveguide 52. More specifically, vertical confinement of the optical mode in the waveguide 52 is provided by the bottom DBR mirror 16 and the top dielectric mirror 32 (layers 32a, 32b) as shown in the cross-sections of FIGS. 3 and 4. Lateral confinement of the optical mode in the waveguide 52 is provided by refractive index changes at the opposed sidewalls 54a, 54b of the waveguide 52 (FIGS. 1, 2, and 4).

In the coupling region (FIG. 7), the waveguide 52 includes a section that extends parallel to and is closely-spaced from a straight section of the microresonator waveguide 44 by the gap region G. In this section of the waveguide 52, lateral confinement of the optical mode is provided by a refractive index change provided by at the periphery of the implant regions 56a, 56b under a top p-type refractory electrode 58 (FIG. 4). The implant regions 56a, 56b are of suitable n+ material and can be formed by localized implantation of a suitable n+ species (such as silicon fluoride ions) into the device structure prior to deposition and patterning of the top refractory electrode 58. The depths of the implant regions 56a, 56b (which is controlled by the implant energy during implantation) encompass the n-type and p-type modulation doped quantum well interfaces 22 and 26, respectively. The implant regions 56a, 56b can be formed along with the implant regions 48a, 48b of the thyristor microresonator 12. The top refractory electrode 58 can be deposited and patterned along with the top p-type anode electrode 30 of the thyristor microresonator 12. Lateral confinement of the optical mode in the waveguide 52 an also be aided by the top dielectric mirror 32 (layers 32a, 32b) formed to cover the sidewalls of waveguide structure 14 as shown. The active area of the waveguide 52 is show as dotted line 59 in the cross section of FIG. 4. An n-type ion implant 60 into a mesa above the n-type modulation doped quantum well interface 26 can be is used to contact the n-type modulation doped quantum well interface 26. N-type metal 62 contacts to the n-type ion implant 60 to form an n-channel electrode that is electrically coupled to the n-type modulation doped quantum well interface 26. As is described in detail below, the index of refraction of the waveguide 52 along the coupling region (FIG. 7) can be varied by application of differential voltage signals between the top electrode 58 and the n-channel electrode 62. This electrically-controlled change in index of refraction can be used to control the evanescent-wave coupling between the waveguide 52 and the waveguide 44 of the microresonator 12 over the coupling region. Alternatively, the evanescent-wave coupling can be controlled by electrical signals supplied to the thyristor microresonator 12 alone. In this configuration, the top electrode 58, the n-channel electrode 62, and the implants 56a, 56b and 60b can be omitted, with the sidewall 54b of the waveguide 52 providing lateral confinement in the waveguide 52 over the coupling region.

As seen in FIGS. 1 and 2, the zig-zag waveguide 52 includes five straight sections coupled by ninety degree bends that are similar in structure to those of the waveguide 44 of the thyristor microresonator 12 as described above. More specifically, each ninety degree bend is defined by a respective forty-five degree facet 64 formed in the sidewalls 54a, 54b of the waveguide 52. For efficient coupling in the coupling region of the two waveguides 44, 52 (FIG. 7), the widths of the two waveguides 44, 52 in this coupling region match one another. Note that the width (and/or other cross-sectional parameter) of the zig-zag waveguide 52 can change or taper over its length if required by the design. The zig-zag structure of the waveguide 52 has several advantages, including but not limited to: 1) it allows the width of the waveguide 52 to be greater than the wavelength of the optical mode propagating therein, and thus reduces the dimensional tolerances and associated manufacturing complexities required for smaller wavelengths (such as wavelengths at or near 1 µm); 2) it provides a long interaction length between the microresonator waveguide 22 and the waveguide 52, which leads to improved coupling efficiency; 3) it allows for effective control over the gap width between the waveguides 52 and 44—this parameter influences the efficiency of the evanescent-wave coupling between the two waveguides and the Q factor of the microresonator 12; 4) it eliminates high order modes generated in the gap region since the bend efficiency drops rapidly when the mode order increases, which can improve system performance by reducing noise; and 5) it provides a high packing density in laying out the structures on the substrate.

In one embodiment, the gap region G in the coupling region of the two waveguides 44, 52 includes implant regions 61a, 61b of n+ material, which can be formed by localized implantation of a suitable n+ species (such as silicon fluoride ions) into the device structure. The depths of the implant regions 61a, 61b (which is controlled by the power level during implantation) encompass the n-type and p-type modulation doped quantum well interfaces 22 and 26, respectively of the device structure as shown in FIG. 4. The implant regions 61a, 61b can be formed along with the implant regions 48a/56a and 48b, 56b. The implant regions 61a, 61b increase the bandgap locally to substantially reduce absorption in the gap region G. This improves the evanescent-wave coupling in coupling region of the two waveguides 44, 52. It is also contemplated that the gap region G can be subjected to impurity free vacancy disordering whereby silicon oxide (or other suitable material) covers the gap region G and is then subjected to rapid thermal annealing. The regions outside of the gap region are covered with a dielectric material (or other suitable protective material) during the rapid thermal annealing operation such that there is essentially no effect of impurity free vacancy disordering in these regions. The disordered region increases the bandgap locally to substantially reduce absorption in the gap region G. This can improve the evanescent-wave coupling in the coupling region of the two waveguides 44, 52.

Figure 6:
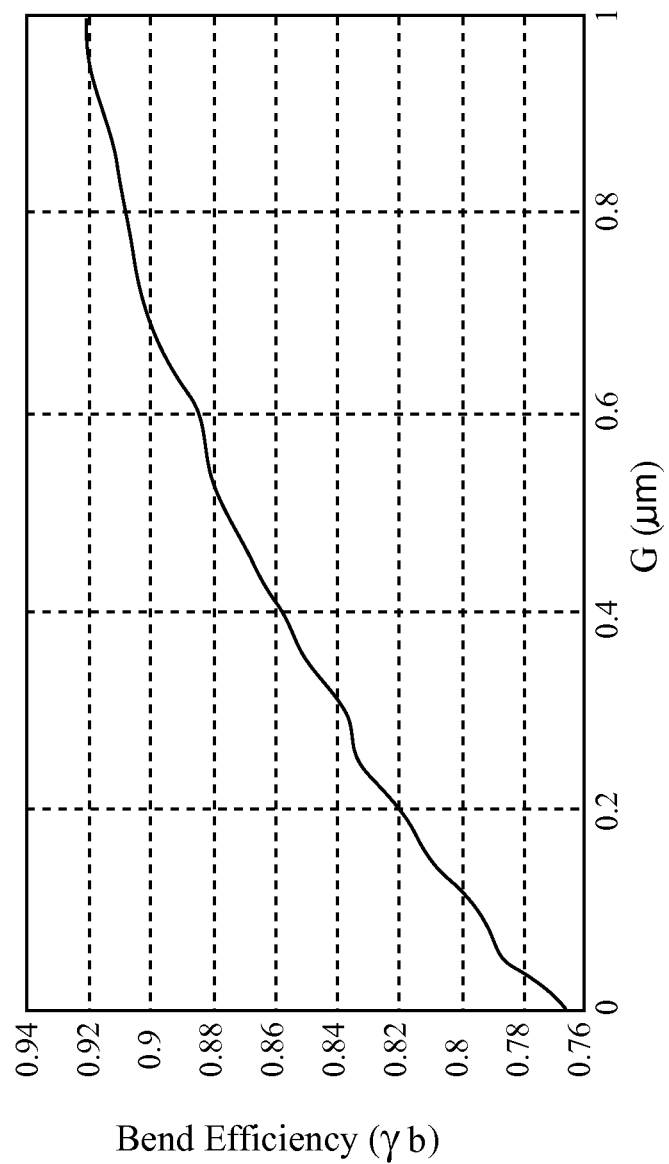
FIG. 6 is an exemplary graph illustrating the variation in bend efficiency as a function of the gap width for the 90 degree bends of the coupling section of the zig-zag waveguide structure of FIG. 1.

It should be noted that for a gap region of small width, the ninety degree bends of the waveguide 52 can be interrupted, and therefore the bend efficiency $\eta_b$ of the respective bend is reduced as shown in the FIG. 6. However, the evanescent-wave coupling between the waveguides 52 and 44 generally increases as the width of the gap region G is reduced. Therefore, it is desirable that the design take into account both factors (bend efficiency and evanescent-wave coupling efficiency) in determining the width of the gap region G.

Figure 7:
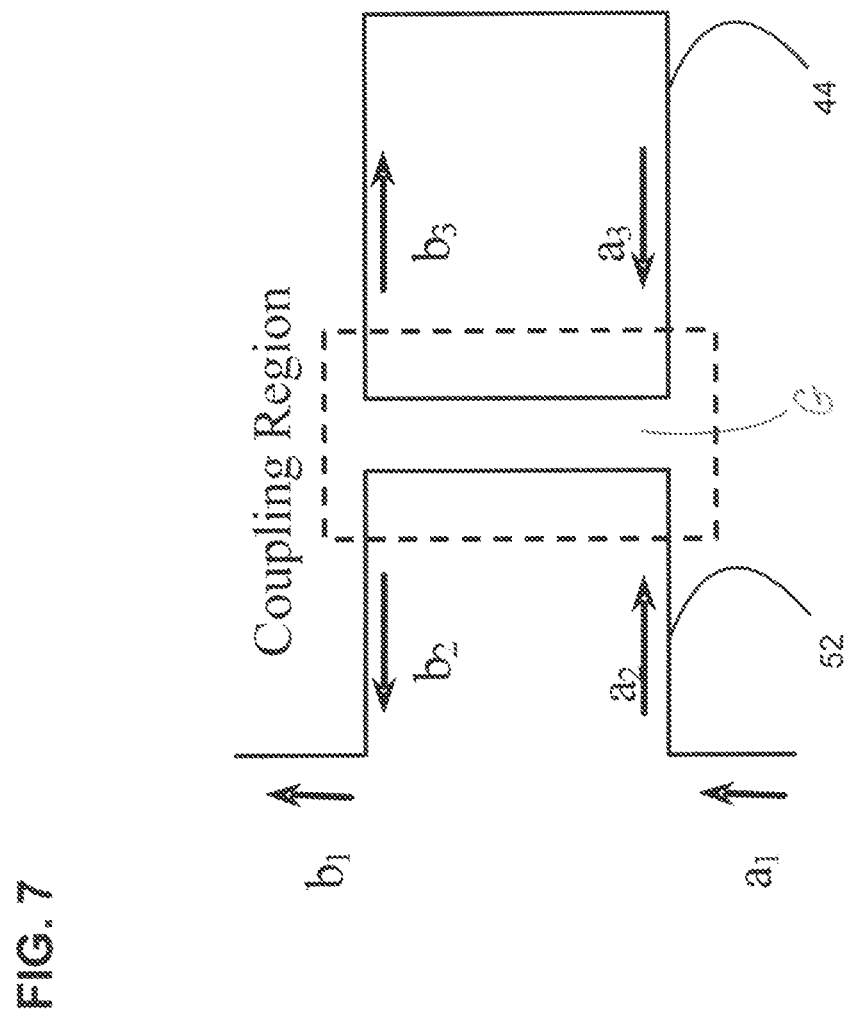
FIG. 7 is a schematic illustration of a mathematic model representing evanescent-wave coupling between the zig-zag waveguide structure and the rectangular closed path waveguide of the thyristor microresonator of FIG. 1.

The evanescent-wave coupling between the waveguides 52 and 44 can be modeled mathematically using a model shown in schematic form in FIG. 7. In this mathematical model, a1 and b1 are the complex amplitudes of the input and output optical signals; a2 and a3 are the complex amplitudes of the optical signals entering the coupling region from the waveguide 52 and from the thyristor microresonator waveguide 44, respectively; and b2 and b3 are the complex amplitudes of the optical signals leaving the coupling region into the waveguide 52 and into the thyristor microresonator waveguide 44, respectively. Their relations can be described by the following equations:

$$a_2(t + \delta_1) = \eta_b e^{-j2\pi v_0 \delta_1} a_1(t), \quad (2)$$

$$\begin{vmatrix} b_2(t+\delta_2) \\ b_3(t+\delta_2) \end{vmatrix} = \begin{vmatrix} t & -j\kappa \\ -j\kappa & t \end{vmatrix} \begin{vmatrix} a_2(t) \\ a_3(t) \end{vmatrix} e^{-j2\pi v_0 \delta_2}, \quad (3)$$

$$a_3(t + \delta_3) = \eta_m \eta_b^2 e^{-j2\pi v_0 \delta_3} e^{-\Gamma \alpha v_g \delta_3} b_3(t), \quad (4)$$

where $\delta_1$, $\delta_2$, and $\delta_3$ represent the time for the optical signals to travel between different locations;
$\eta_m$ is the mode mismatch coefficient accounting for the loss due to the different contact levels;
$\eta_b$ is the characteristic bend efficiency of the ninety degree corners of the thyristor microresonator waveguide 44;
$v_0$ and $v_g$ are the light frequency and velocity in the semiconductor;
$\alpha$ is the absorption coefficient of the thyristor microresonator waveguide 44;

$\Gamma$ is the confinement factor; and
t and $\kappa$ are coupling coefficients for the coupling region.
The coupling coefficients t and $\kappa$ can be related to the parameter $\eta_c$, which is the loss coefficient due to scattering loss in the gap region G as follows:

$$t^2 + \kappa^2 = \eta_c^2. \quad (5)$$

Figure 8:
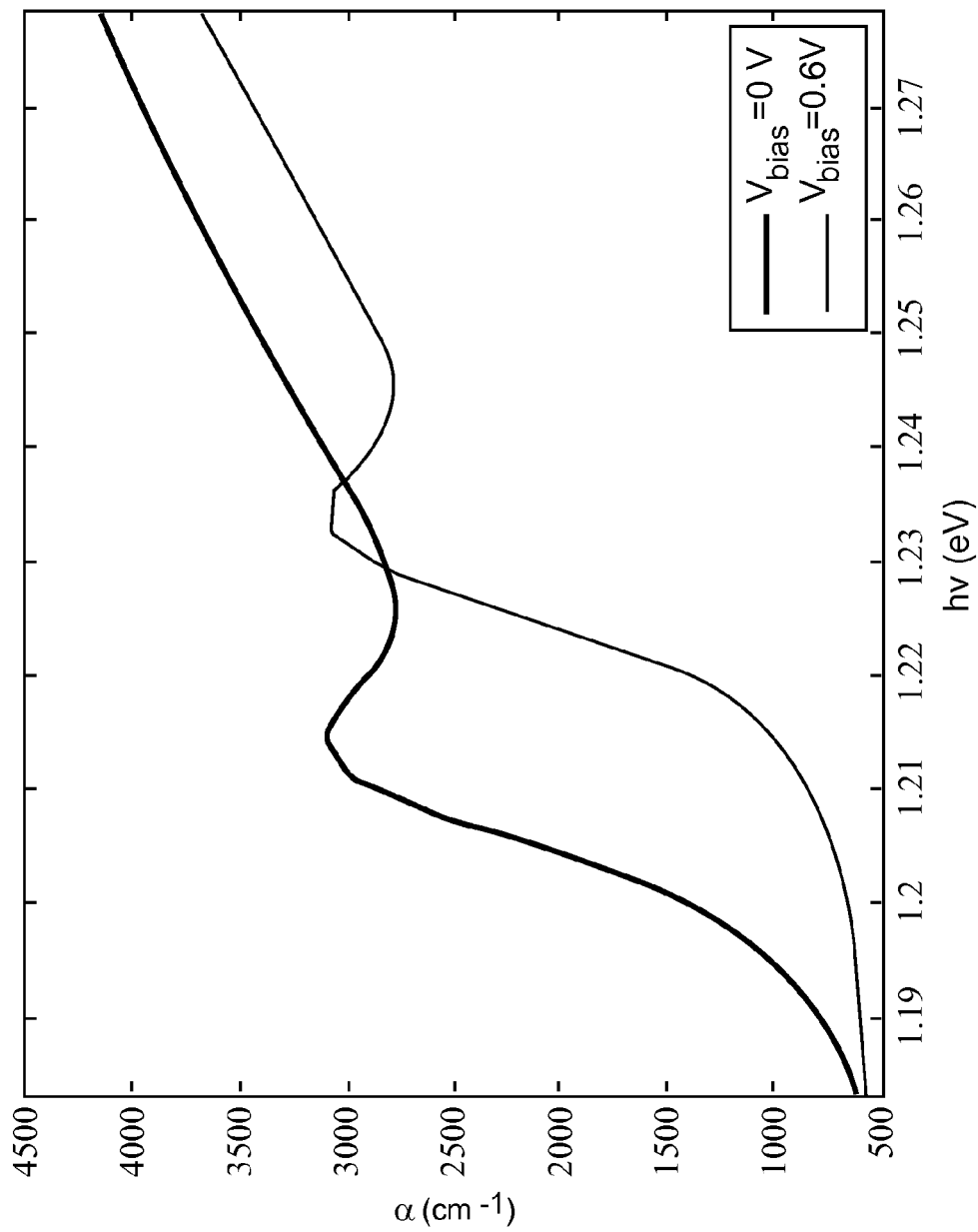
FIG. 8 is an exemplary graph illustrating the absorption coefficient α as a function of photon energy for the thyristor microresonator of FIG. 1 for two different differential bias voltages applied between the anode electrode and the n-channel injector electrode of the thyristor microresonator.
Figure 9:
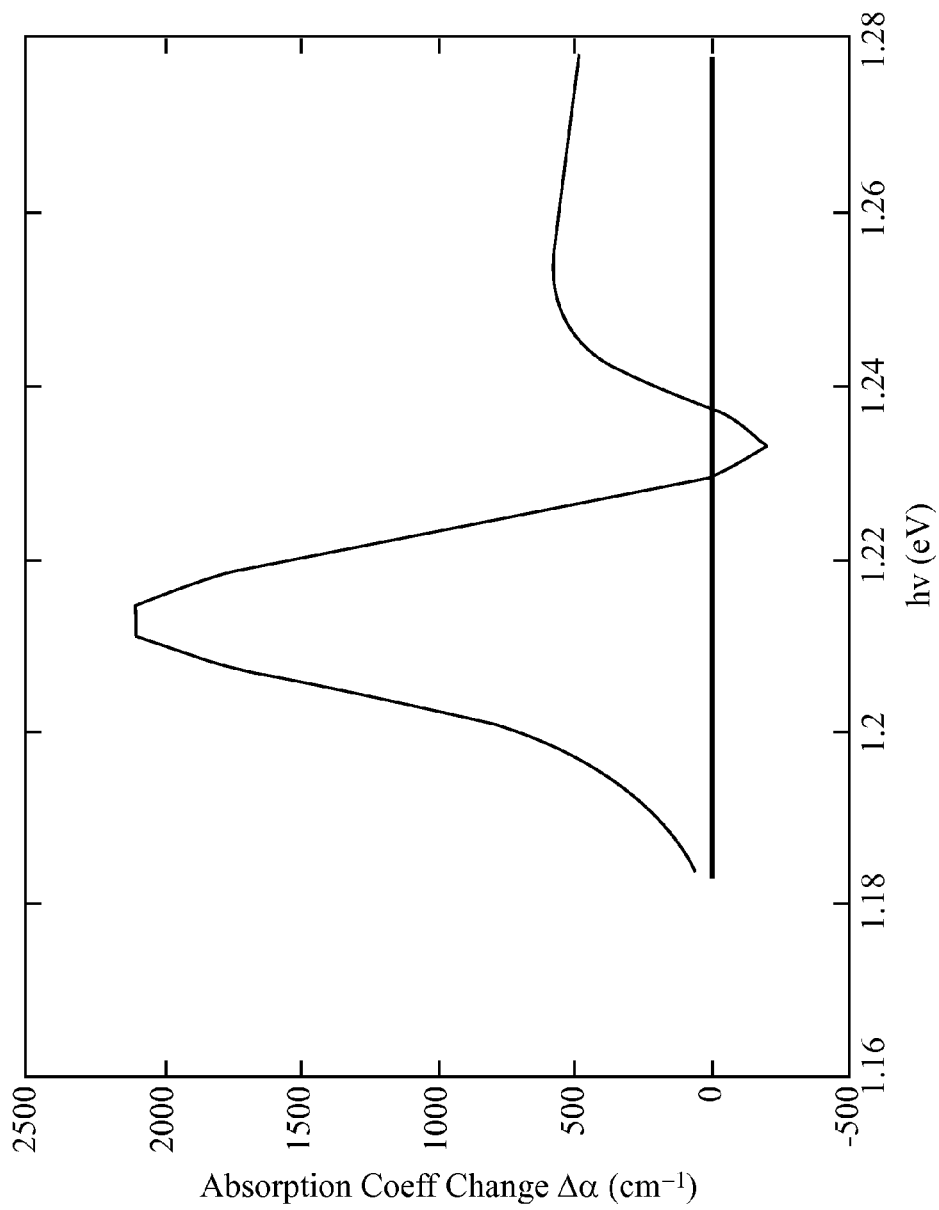
FIG. 9 is an exemplary graph illustrating the change of the absorption coefficient as a function of photon energy for the thyristor microresonator of FIG. 1 for the two different bias voltages shown in FIG. 8.

Except for the absorption coefficient $\alpha$, the other parameters used in Eqns. (2) through (5) can be modeled using optical Finite-Difference Time-Domain (FDTD) numerical methods. For an exemplary device with a W of 1 μm, G of 0.25 μm, Offset of 0.2 μm, L1 of 3 μm and L2 of 13 μm, the parameter $\eta_b$ is 0.995, the parameter $\eta_m$ is 0.93, the parameter $\eta_c$ is 0.8356, and the parameter $\Gamma$ is 0.02. The absorption coefficient $\alpha$ depends upon the amount of charge filling the quantum well(s) of the n-type modulation doped interface 26 of the thyristor microresonator 12, which can operate to shift the absorption edge of the thyristor microresonator 12 to shorter wavelengths (blue shift). More specifically, a generalized absorption model can be used to represent the absorption coefficient $\alpha$ in terms of the carrier Fermi energy. Then the blue shift of the absorption edge is determined by the charge density of the n-type modulation doped interface 26 in which the Fermi level is controlled by a differential voltage between the anode electrode 30 and the n-channel injector electrode 38. The absorption model can be based upon a relaxed k-selection rule and Lorentzian weighting function as set forth in Y. Zhang, T. A. Vang, and G. W. Taylor, "Transistor based quantum well optical modulator and its performance in RF links." Proc. SPIE 7817, 12-22 (2010), herein incorporated by reference in its entirety. By using this model, the relation of the absorption coefficient $\alpha$ to photon energy for the thyristor microresonator 12 with different differential bias voltages between the anode electrode 30 and the n-channel injector electrode 38 can be determined as shown in FIG. 8. The change of absorption coefficient as a function of photon energy can also be determined as shown in FIG. 9.

Figure 10:
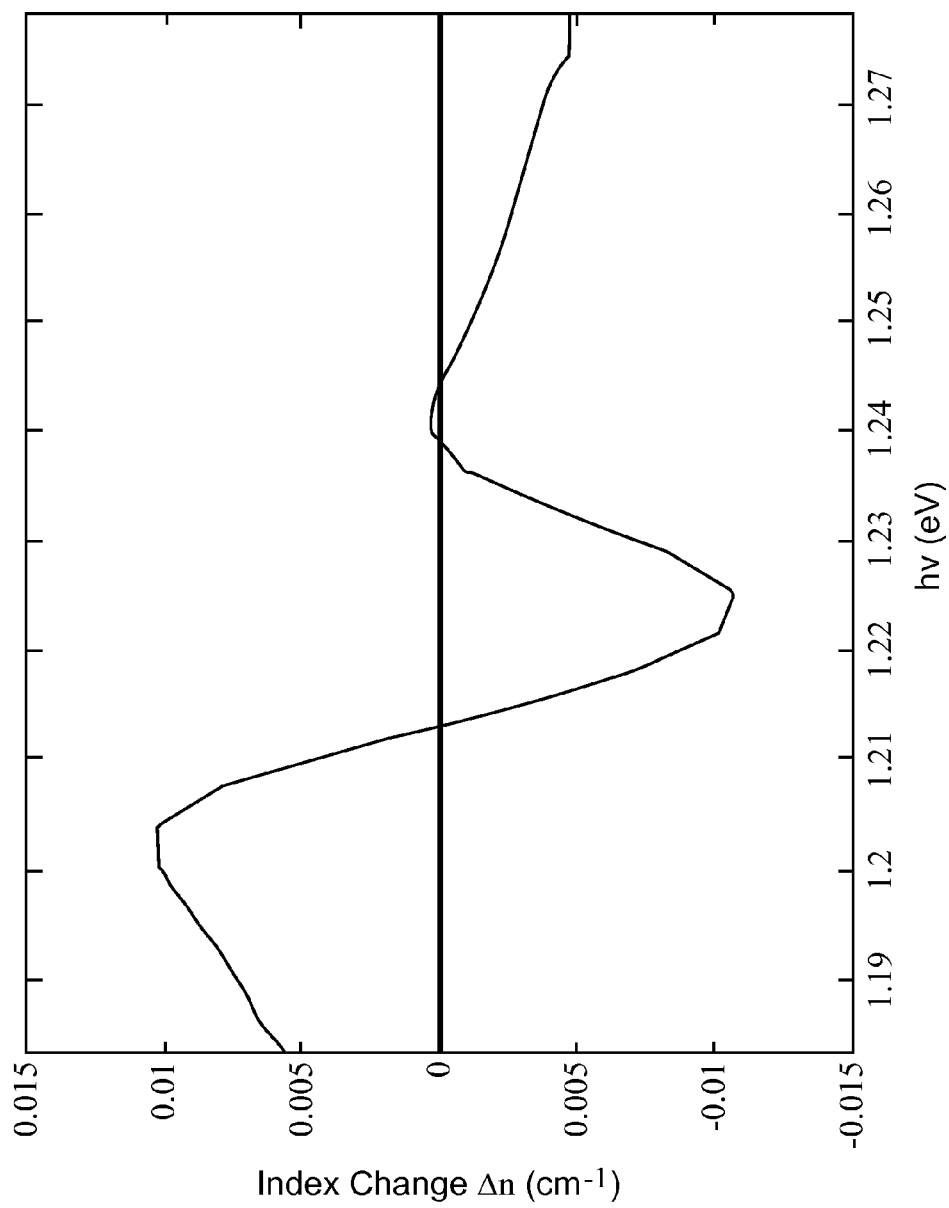
FIG. 10 is an exemplary graph illustrating the change in refractive index as a function of photon energy for the thyristor microresonator of FIG. 1 for the two different bias voltages shown in FIG. 8.

The change of the absorption coefficient of the thyristor microresonator 12 changes the real part of the refractive index of the thyristor microresonator 12 as specified by the Kramers-Kronig relations as $$\Delta n(\omega) = \frac{c}{\pi} P \int \frac{\Delta \alpha(\omega')}{\omega'^2 - \omega^2} d\omega' \quad (6)$$

where P is the Cauchy principal integral.
This relation can be used to determine the change in the real part of the refractive index of the thyristor microresonator 12 as a function of photon energy of the thyristor microresonator as shown in FIG. 10.

Another effect of increased carrier density in the quantum well(s) of the n-type modulation doped interface 26 of the thyristor microresonator 12 is the electro-optic effect caused by the strong electric field at the quantum well-barrier interface. This effect can be represented as:

$$\Delta n_{eo} = \frac{1}{2} r_{41} E_0 n_m^3, \quad (7)$$

where $E_o$ is the quantum well electric field, $r_{41}$ is the linear electro-optical coefficient for <100> GaAs and $n_m$ is the material refractive index.

Therefore, the total change of refractive index in the quantum well(s) of the n-type modulation doped interface 26 of the thyristor microresonator 12 can be expressed as:

$$\Delta n_{qw} = \Delta n_{kk} + \Delta n_{eo}. \qquad (8)$$

Evaluation of $\Delta n_{kk}$ and $\Delta n_{eo}$ with typical device parameters reveal that for the blue shifted thyristor microresonator 12, $\Delta n_{kk}$ is the dominant contributor. The index change $\Delta n_{qw}$ describes the refractive change in the quantum well alone. The index change of the waveguide 44 of the thyristor microresonator 12 is essentially proportional to $\Delta n_{qw}$ with a proportionality constant of $e_i$ of approximately 0.2. Hence, the effective refractive index of the waveguide 44 of the thyristor microresonator 12 can be expressed as:

$$n_{eff} = n_m + \Delta n_m = n_m + e_i \Delta n_{qw}. \qquad (9)$$

The differential voltage applied between the anode electrode 30 and the n-channel injector electrode 38 of the thyristor microresonator 12 can be used to control the absorption edge of the thyristor microresonator 12 and thus control the absorption coefficient of the thyristor microresonator 12. According to the Kramers-Kronig relations, the refractive index of the quantum wells of the type modulation doped interface 26 is changed and thus also the effective refractive index of the thyristor microresonator 12. Basically the effective optical length of the thyristor microresonator 12 is changed and therefore the wavelength spectrum is shifted. In addition, the extinction ratio of the wavelength spectrum has changed. Therefore, for optical input at a fixed wavelength, applied voltage can control the optical coupling between the two waveguides 52, 44.

Figure 11:
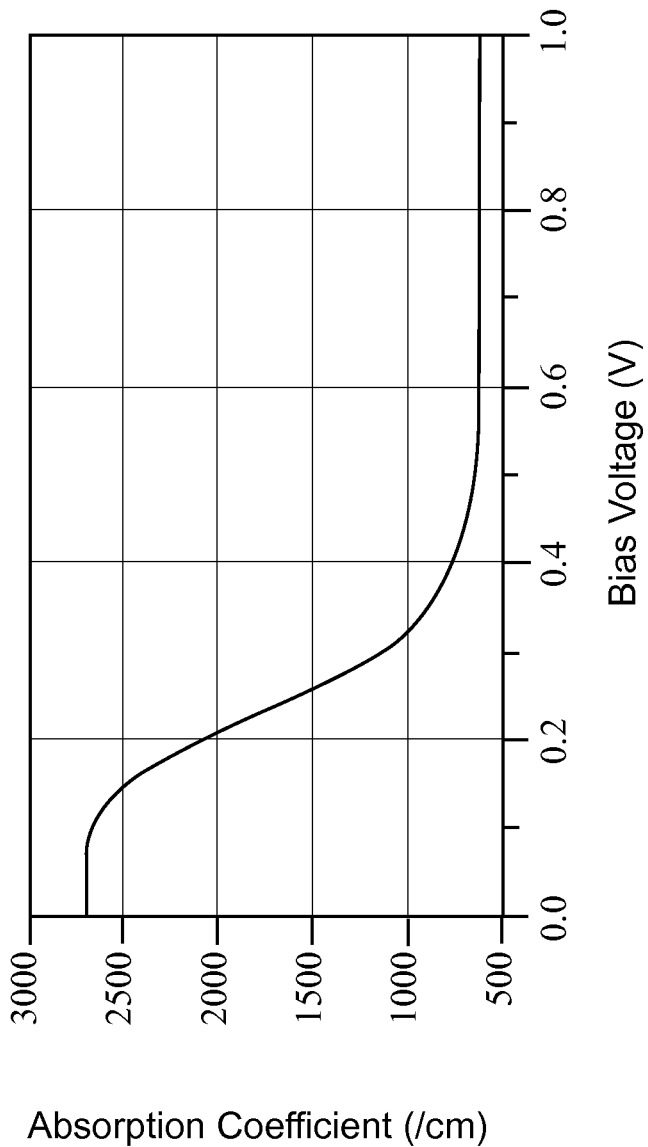
FIG. 11 is a graph of the absorption coefficient α as a function of differential bias voltage applied between the anode electrode and the n-channel injector electrode for an exemplary thyristor microresonator structure.
Figure 12:
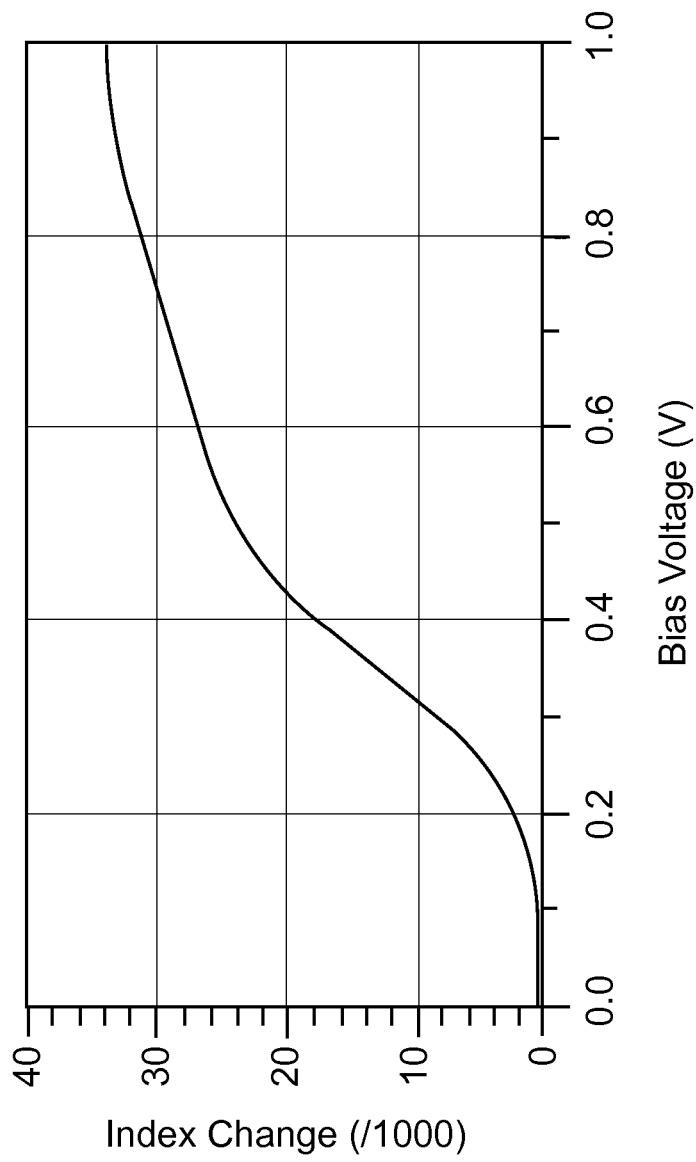
FIG. 12 is a graph illustrating the change in refractive index as a function of differential bias voltage applied between the anode electrode and the n-channel injector electrode for the exemplary thyristor microresonator of FIG. 11.
Figure 13:
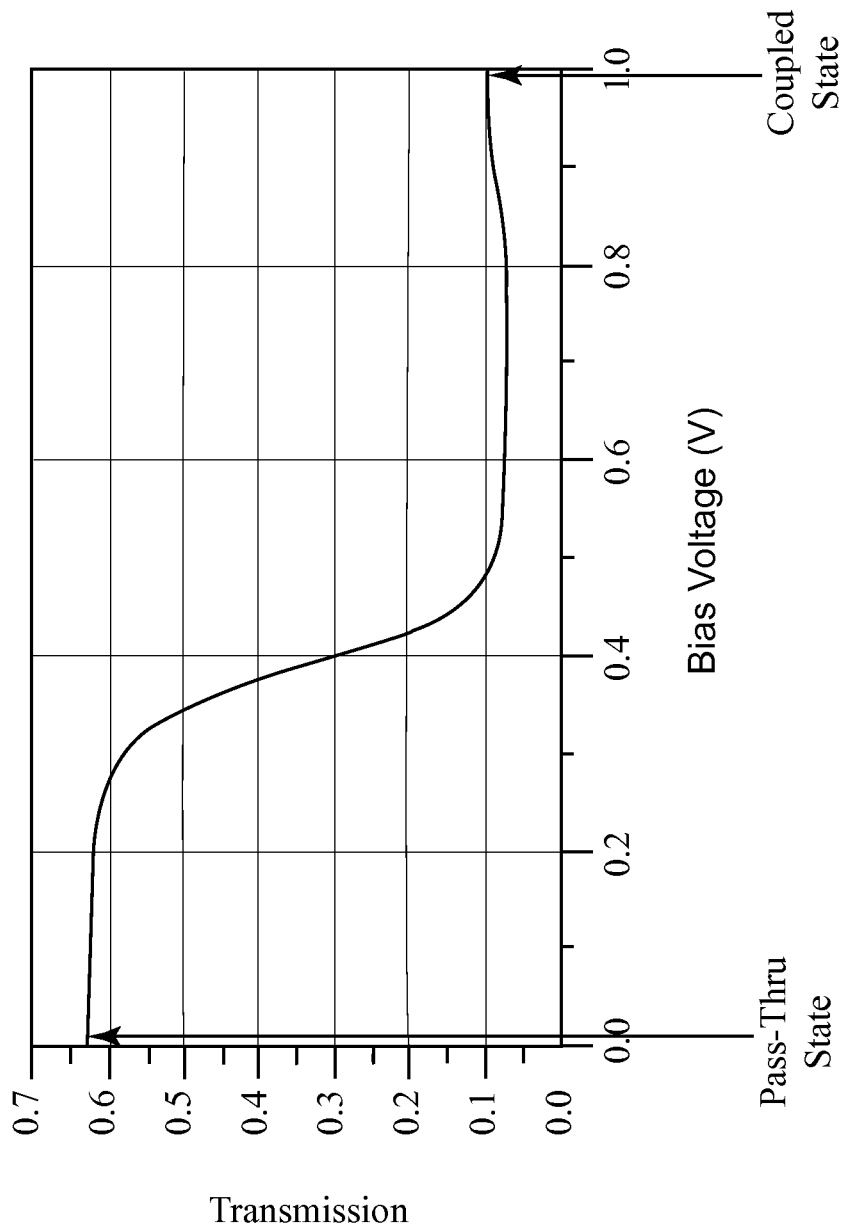
FIG. 13 is a graph illustrating optical signal transmission through the zig-zag waveguide as a function of differential bias voltage applied between the anode electrode and the n-channel injector electrode of the exemplary thyristor microresonator of FIG. 11.

The dependence of the absorption coefficient, refractive index change and transmission of the device as a function of applied bias voltage for an exemplary thyristor microresonator 12 is shown in FIGS. 11, 12 and 13, respectively. FIG. 13 shows that for a differential voltage between the anode electrode 30 and the n-channel injector electrode 38 of the exemplary thyristor microresonator 12 near 0.0V, there is reduced evanescent-wave coupling between the waveguides 52 and 44. This is the pass-thru state of the device where the input optical signal passes through the waveguide 52 with limited optical loss. For a positive differential voltage between the anode electrode 30 and the n-channel injector electrode 38 of the exemplary thyristor microresonator 12 near 1.0V, there is increased evanescent-wave coupling between the waveguides 52 and 44. This is the coupled state of the device where the input optical signal is transferred from the waveguide 52 to the waveguide 44. The differential voltage applied to the anode electrode 30 and the n-channel injector electrode 38 can be varied over time between these two levels/states (for example, with a sinusoidal signal whose amplitude varies between these levels) to modulate the input optical signal over time. Note that the extinction ratio of the exemplary thyristor microresonator 12 is about 10.4 dB as is evident from FIG. 13.

Figure 14:
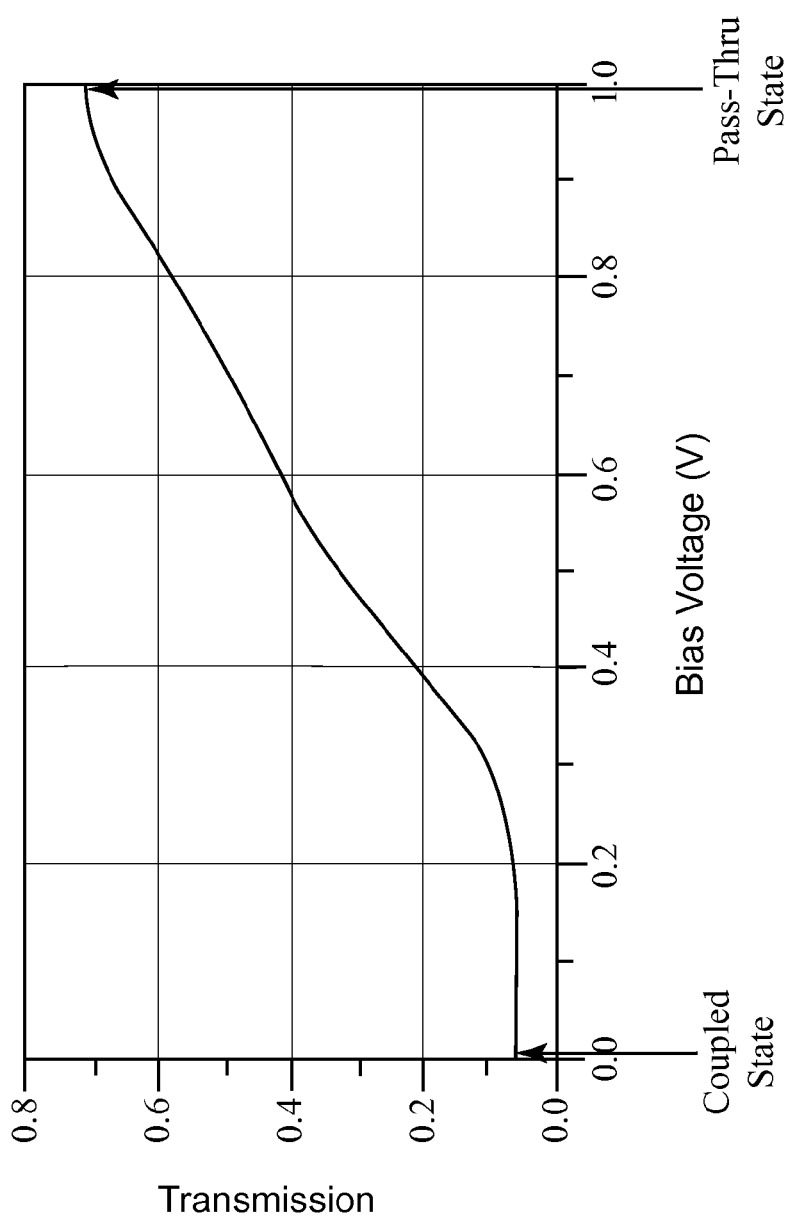
FIG. 14 is a graph illustrating optical signal transmission through the zig-zag waveguide as a function of differential bias voltage applied between the top electrode and the n-channel electrode of the zig-zag waveguide structure for an exemplary thyristor microresonator and zig-zag waveguide structure.

Although changing of the refractive index of the thyristor microresonator 12 can control the transmission of the input optical signal through the coupling region in order to modulate the input optical signal, the transmission curve can be very sensitive to the size of the thyristor microresonator 12. One solution that addresses this problem is to change the coupling coefficient between the waveguide structure 14 and the thyristor microresonator 12 utilizing electrical control of the channel charge in the waveguide 52 of the waveguide structure 14. When a positive voltage is applied between the top electrode 58 and the n-channel electrode 62 of the waveguide structure 14, charge from the top electrode 58 is induced to flow from the top electrode 58 into the adjacent section of the waveguide 52 (in the path of the propagating optical input). This charge induces a refractive index change in the waveguide 52 that reduces the evanescent-wave coupling between the two waveguides 44, 52 in the coupling region. Thus, by controlling the coupling coefficient independently, the bias voltages of the thyristor microresonator 12 can be fixed and adjusted independently to tune the resonance of the thyristor microresonator 12 to match the input wavelength and to eliminate variability that results from the fabrication and growth procedures. Specifically, the ON state current of the thyristor microresonator 12 controls the charge density in the n-type modulation doped quantum well interface 26 of the epitaxial layer structure of the thyristor microresonator 12, which controls the effective refractive index in the active area 49 of the waveguide 44 of the thyristor microresonator 12 due to Kramers-Kronig relations. FIG. 14 shows the transmission of the input optical signal through the coupling region of the two waveguides 44, 52 as a function of bias voltage for this configuration. FIG. 14 shows that for a positive differential voltage between the top electrode 58 and the n-channel electrode 62 of the waveguide structure 14 near 1.0V, there is reduced evanescent-wave coupling between the two waveguides 44, 53 in the coupling region. This is the pass-thru state of the device where the input optical signal passes through the waveguide 52 with limited optical loss. For a differential voltage between the top electrode 58 and the n-channel electrode 62 of the waveguide structure 14 near 0.0V, there is increased evanescent-wave coupling between the two waveguides 44, 52 in the coupling region. This is the coupled state of the device where the input optical signal is transferred from the waveguide 52 to the waveguide 44. The differential voltage applied to the top electrode 58 and the n-channel electrode 62 of the waveguide structure 14 can be varied over time between these two levels/states (for example, with a sinusoidal signal whose amplitude varies between these levels) to modulate the input optical signal over time.

Figure 15:
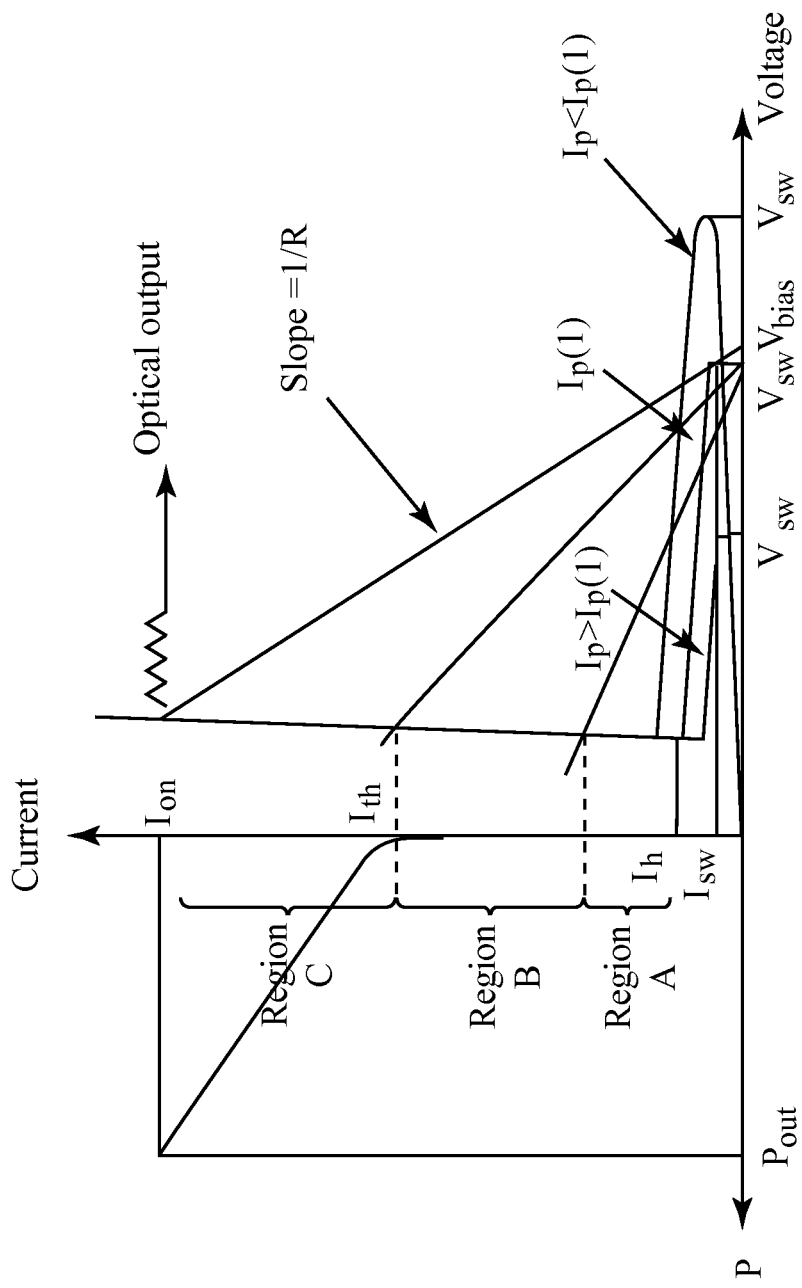
FIG. 15 is an exemplary I-V-P curve illustrating a number of operational modes as a function of bias resistance for the thyristor microresonator of the present invention.

FIG. 15 shows the I-V-P schematic characteristic of an exemplary thyristor microresonator 12. By setting the DC bias resistance to a corresponding mode specific value, the thyristor microresonator 12 may be biased for a low absorption mode (region A), an optical amplification mode (region B), or a laser operation mode (region C). For optical modulation (FIGS. 16 and 17), the DC bias resistance is set to a value for the low absorption mode (region A) where the ON state current flow, charge density and absorption loss is minimized. However, for some configurations, the DC bias resistance can be set to a value for the optical amplification mode (region B), which is above the transparency of the quantum wells. Effectively, at the transition into region B, the absorption coefficient α approaches 0. As the bias is increased in region B towards the lasing mode (region C), the function of the optical amplifier is obtained where the absorption coefficient α is effectively negative. The optical amplifier function may compensate for optical losses in a switch fabric or it may be utilized at output port to compensate for the total loss accumulated through any particular path through the switch fabric. The optical amplification mode can also be used to increase the bandwidth of the switch fabric, and/or add additional wavelength channels to the switch fabric.

Figure 16:
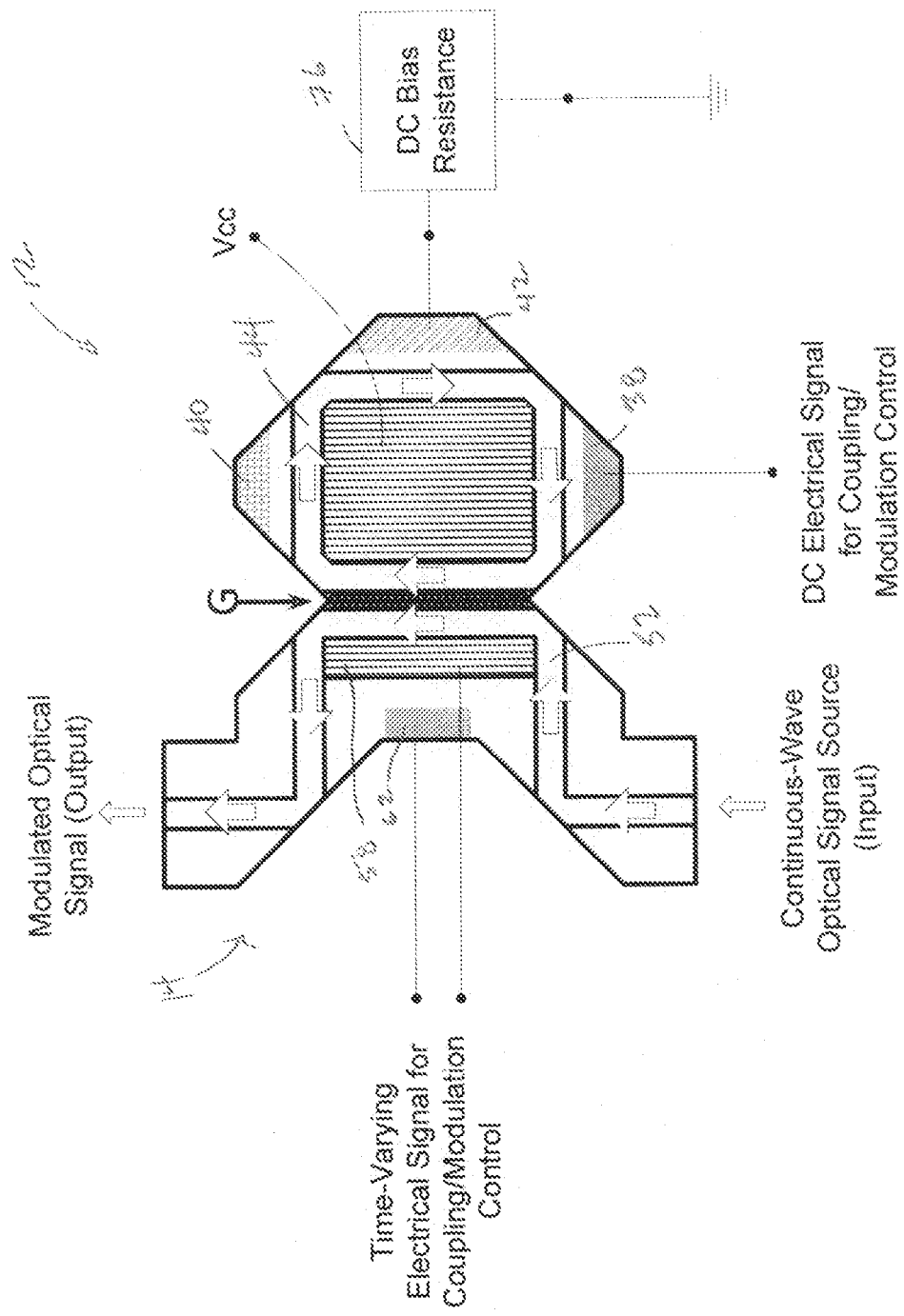
FIG. 16 is a schematic top view of an exemplary configuration of the monolithic optoelectronic device of FIG. 1 as an optical modulator.

FIG. 16 shows an exemplary configuration of the thyristor microresonator 12 and optically-coupled waveguide structure 14 for optical modulation. An optical signal source (which could be on-chip or off-chip laser and associated waveguide coupling or other suitable optical element) supplies a continuous-wave optical signal as input to the waveguide 52 of the waveguide structure 14. The anode electrode 44 of the thyristor microresonator 12 is electrically coupled to a positive DC voltage (labeled $V_{cc}$), and the cathode electrode 42 is electrically coupled to ground potential through DC bias resistance 76. The DC bias resistance 76 can be integrated on-chip (i.e., on the substrate 18) or off-chip. The DC bias resistance 76 is selected such that the ON state current of the thyristor microresonator 12 is in the low absorbance mode (region A) of FIG. 15. A DC electrical signal is supplied to the n-channel injector electrode 38 of the thyristor microresonator 12. The DC electrical signal supplied to the n-channel injector electrode 38 can be selected to tune the resonance wavelength of the thyristor microresonator 12 to match the input wavelength of the input optical signal. This can aid in reducing the variability of the resonance wavelength that results from the fabrication and growth procedures. A time-vary differential signal is supplied to the top electrode 58 and the n-channel electrode 62 of the waveguide structure 14 to modulate the input optical signal over time as described above in detail with respect to FIG. 14. The modulation of the input optical signal produces a modulated optical signal that propagates from the coupling region of waveguide 52 and is output from the waveguide 52 as shown. The modulated optical signal output from the waveguide 52 can have an optical OOK modulation format (i.e., digital pulsed-mode) or possibly a higher order optical modulation format (such as optical differential phase shift keying format or optical differential quadrature phase shift keying format).

Figure 17:
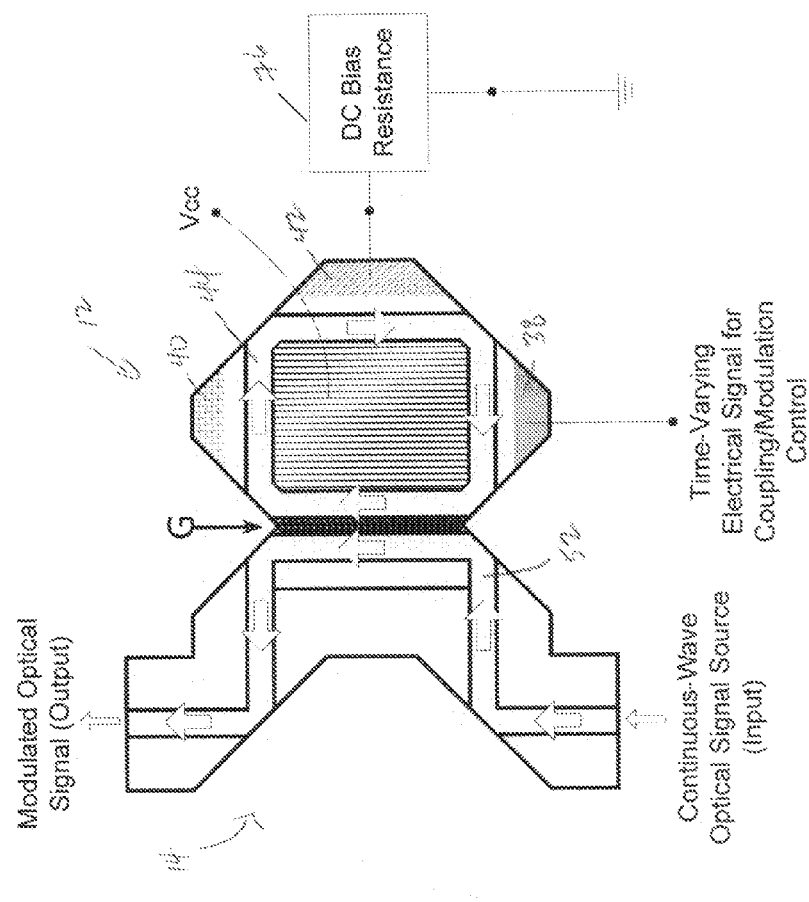
FIG. 17 is a schematic top view of another exemplary configuration of the monolithic optoelectronic device of FIG. 1 as an optical modulator.

FIG. 17 shows another exemplary configuration of the thyristor microresonator 12 and optically-coupled waveguide structure 14 for optical modulation. An optical signal source (which could be on-chip or off-chip laser and associated waveguide coupling or other suitable optical element) supplies a continuous-wave optical signal as input to the waveguide 52 of the waveguide structure 14. The anode electrode 44 of the thyristor microresonator 12 is electrically coupled to a positive DC voltage (labeled $V_{cc}$), and the cathode electrode 42 is electrically coupled to ground potential through DC bias resistance 76. The DC bias resistance 76 can be integrated on-chip (i.e., on the substrate 18) or off-chip. The DC bias resistance 76 is selected such that the ON state current of the thyristor microresonator 12 is in the low absorbance mode (region A) of FIG. 15. A time-vary electrical signal is supplied to the re-channel injector electrode 38 of the thyristor microresonator 12 to modulate the input optical signal over time as described above in detail with respect to FIG. 13. The modulation of the input optical signal produces a modulated optical signal that propagates from the coupling region of waveguide 52 and is output from the waveguide 52 as shown. The modulated optical signal output from the waveguide 52 can have an optical OOK modulation format (i.e., digital pulsed-mode optical signal) or possibly a higher order optical modulation format (such as optical differential phase shift keying format or optical differential quadrature phase shift keying format).

The optical modulators of FIGS. 16 and 17 are advantageous in that:
- there is relatively low consumption of static power (because the current flow and applied voltage associated with charge control of the quantum well are relatively small);
- higher speed operation is achievable relative to SOI modulator structures (because the problem of charge removal in the intrinsic region of the p-i-n modulator is avoided); and
- the modulator structure is compatible with fabrication of electronic devices (and other optoelectronic devices in the same epitaxial structure.

Figure 20:
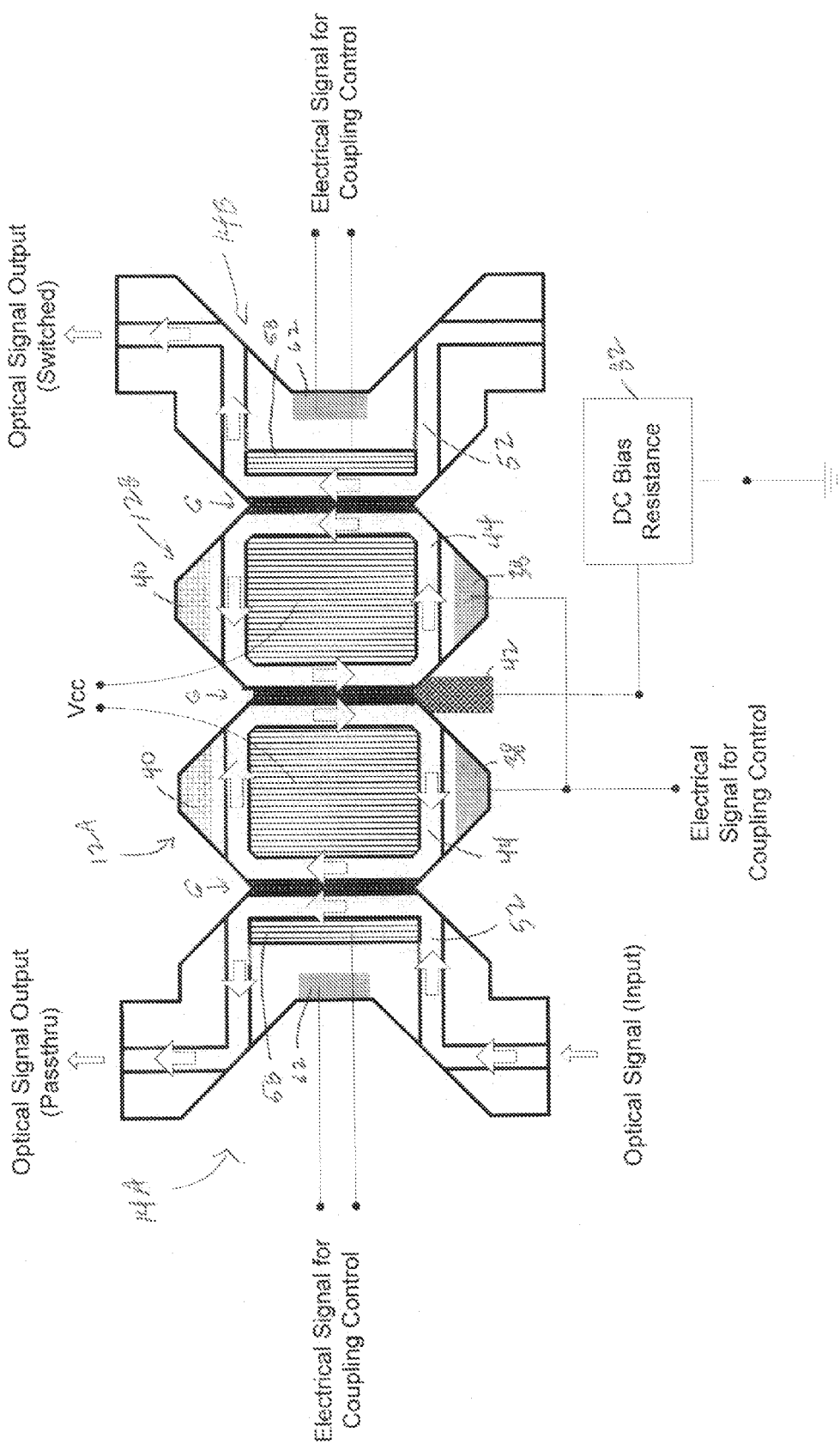
FIG. 20 is a schematic top view of a monolithic optical switch device utilizing two pairs of a thyristor microresonator and optically-coupled zig-zag waveguide structure; the thyristor microresonators are also optically coupled to one another by evanescent-wave coupling.
Figure 21:
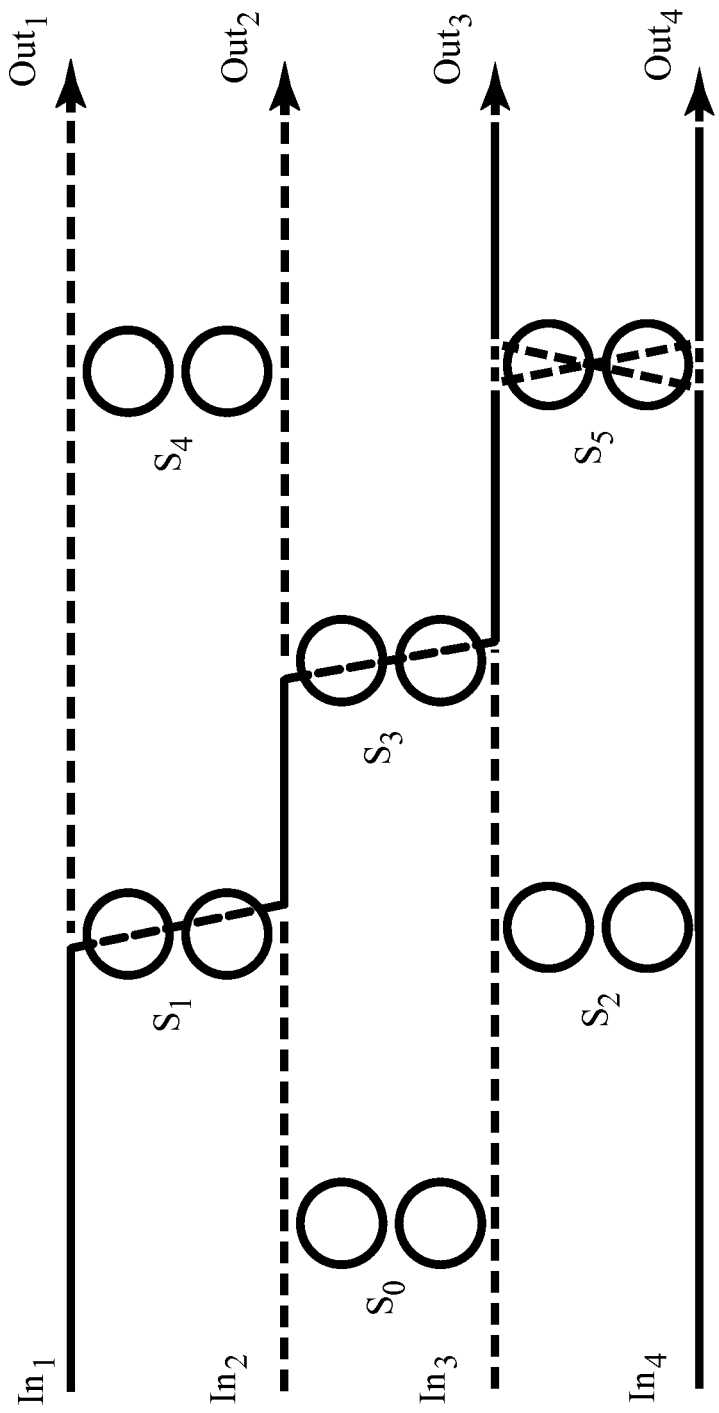
FIG. 21 is a schematic view of a switch fabric utilizing a number of the optical switch devices of FIG. 20.
Figure 22:
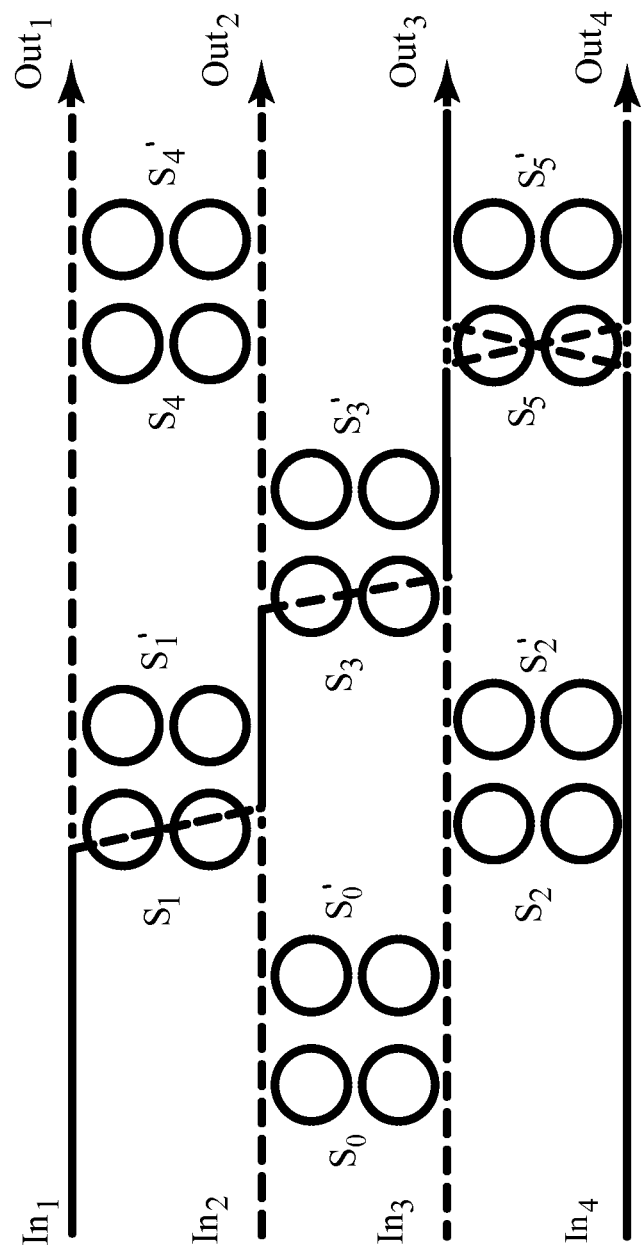
FIG. 22 is a schematic view of another switch fabric utilizing a number of the optical switch devices of FIG. 20; the switch fabric of FIG. 22 is suitable for wavelength division multiplexing applications where optical input signals of different wavelengths are switched between the input and output ports of the switch fabric.

The thyristor microresonator 12 and optically-coupled waveguide structure 14 can be configured for other optoelectronic functions, including but not limited to a laser (FIG. 18), an optical detector (FIG. 19), optical switch (FIG. 20), and optical switch fabric (FIGS. 21 and 22).

Figure 18:
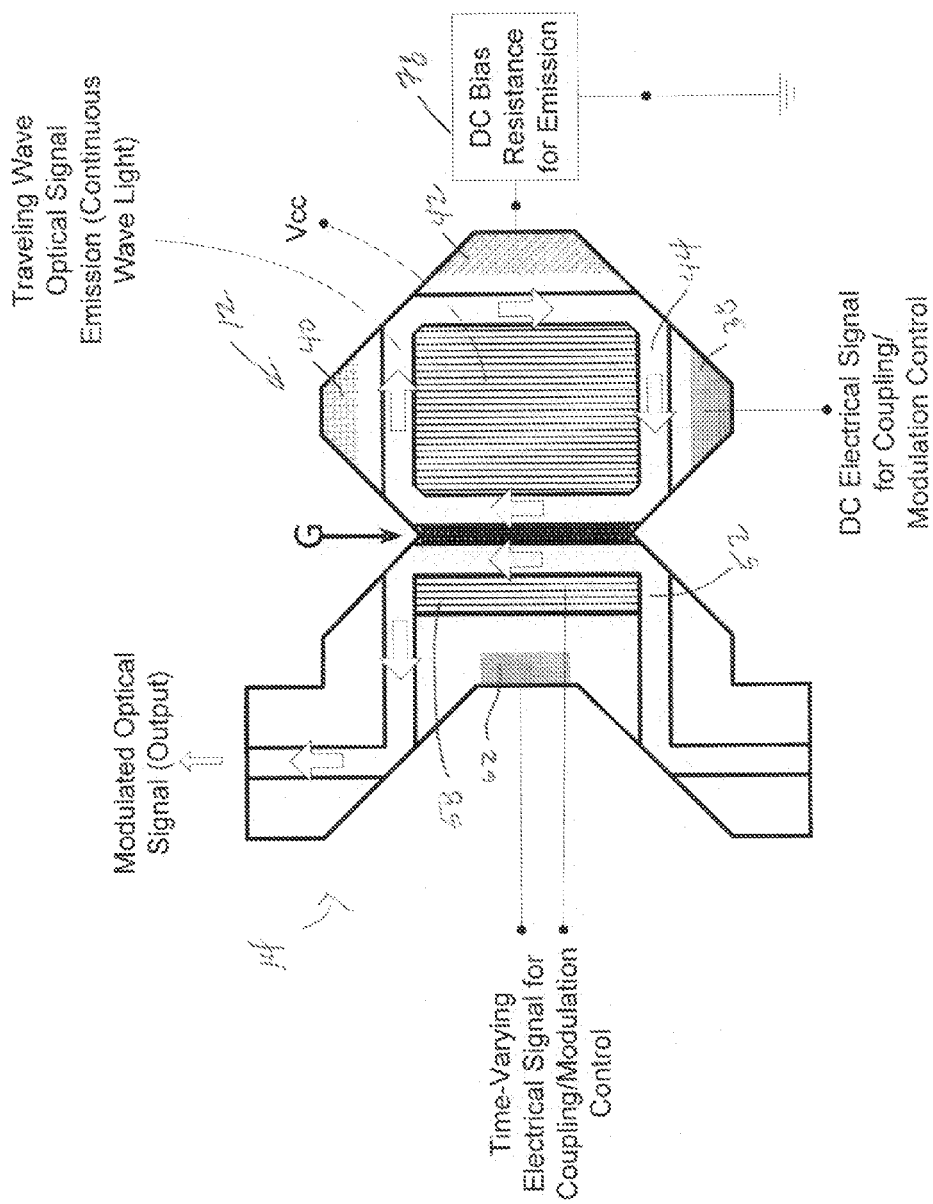
FIG. 18 is a schematic top view of an exemplary configuration of the monolithic optoelectronic device of FIG. 1 as an in-plane laser.

FIG. 18 shows an exemplary configuration of the thyristor microresonator 12 and optically-coupled waveguide structure 14 for an in-plane laser. The anode electrode 44 of the thyristor microresonator 12 is electrically coupled to a positive DC voltage (labeled $V_{cc}$), and the cathode electrode 42 is electrically coupled to ground potential through DC bias resistance 78. The DC bias resistance 78 can be integrated on-chip (i.e., on the substrate 18) or off-chip. The DC bias resistance 78 is selected such that the ON state current of the thyristor microresonator 12 is in the laser operation mode (region C) of FIG. 15. A DC electrical signal is supplied to the n-channel injector electrode 38 of the thyristor microresonator 12 such that the thyristor microresonator 12 generates a continuous-wave optical signal that propagates clockwise in the waveguide 44. The DC electrical signal supplied to the n-channel injector electrode 38 can be selected to tune the resonance wavelength of the thyristor microresonator 12 to match the desired wavelength of the output optical signal. This can aid in reducing variability of the resonance wavelength that results from the fabrication and growth procedures. Concurrent with such operation, a time-vary differential electrical signal (typically an RF signal) is supplied to the top electrode 58 and the n-channel electrode 62 of the waveguide structure 14 to modulate the evanescent-wave coupling between the two waveguides 44, 52 in the coupling region over time (similar to the modulation described above in detail with respect to FIG. 14). Such coupling modulation generates a modulated optical signal based upon the continuous-wave optical signal that propagates clockwise in the waveguide 44. The modulated optical signal propagates from the coupling region of the waveguide 52 and is output from the waveguide 52 as shown. The modulated optical signal output from the waveguide 52 can have an optical OOK modulation format (i.e., digital pulsed-mode optical signal) or possibly a higher order optical modulation format (such as optical differential phase shift keying format or optical differential quadrature phase shift keying format).

Figure 19:
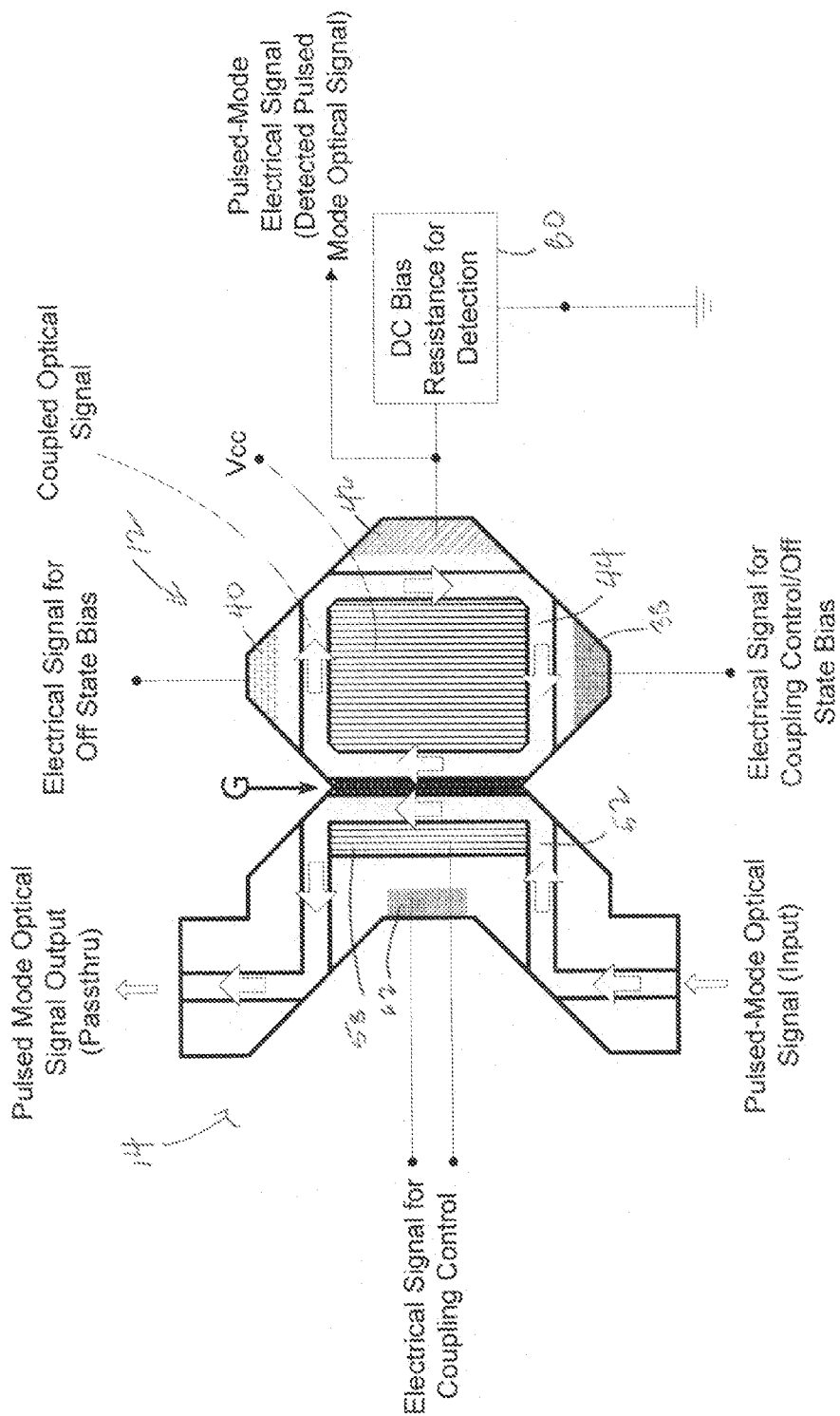
FIG. 19 is a schematic top view of an exemplary configuration of the monolithic optoelectronic device of FIG. 1 as an optical detector.

Note that the configuration of FIG. 19 transfers the time-varying electrical signal (e.g., RF signal) supplied to the top electrode 58 and the n-channel electrode 62 onto an optical carrier derived from the continuous-wave optical signal that propagates clockwise in the waveguide 44. This combines the continuous wave laser function and modulation function into the structure of the thyristor microresonator. This is significantly different than the typical prior art where a continuous wave laser (separate from a modulator device) propagates light to the modulator device and an RF signal is applied to the center contact of the modulator device for modulating. Combining the continuous wave laser function and modulation function into the structure of the thyristor microresonator is efficient and also avoids the problem of tuning the resonance wavelength of the modulator to match the continuous wave laser. Moreover, the configuration of FIG. 19 effectively modulates the reflectivity of the resonance cavity of the thyristor microresonator in accordance with the time-varying electrical signal (e.g., RF signal) supplied to the top electrode 58 and the n-channel electrode 62. This is the operation of a Q switched laser where the electrical signals that drive to the continuous wave laser remain fixed while concurrently supplying electrical signals that modulate an optical property (the reflectivity R) of the resonance cavity of the thyristor microresonator. In this manner, the photon density in the resonance cavity increases by changing the reflectivity R (and not by changing the electron density as in gain switching). And the reflectivity R can be changed at very high speed (speed limitation of the modulator) as compared to changing the electron density (as in gain switching). Thus, very high speed optical modulation can be supported.

For continuous-wave emission of the laser, a DC differential electrical signal can be supplied to the gate electrode 58 and the n-channel electrode 62 of the waveguide structure 14 (instead of the time-varying signal for the modulated emission). The DC electrical signal controls the device to operate in the coupled state (similar to the coupled state described above in detail with respect to FIG. 14). In this coupled state, the continuous-wave optical signal that propagates clockwise in the waveguide 44 is transferred to the waveguide 52 (in the coupling region of waveguide 52) and is output from the waveguide 52 similar to the modulated optical signal shown in FIG. 18.

FIG. 19 shows an exemplary configuration of the thyristor microresonator 12 and optically-coupled waveguide structure 14 for an optical detector. A modulated optical signal having an optical OOK modulation format (i.e., digital pulsed-mode optical signal) is supplied as input to the waveguide 52 of the waveguide structure 14. The input optical signal could be supplied from an off-chip source (such as a fiber optic carrier) or an on-chip optical source. The anode electrode 44 of the thyristor microresonator 12 is electrically coupled to a positive DC voltage (labeled $V_{cc}$), and the cathode electrode 42 is electrically coupled to ground potential through DC bias resistance 80. The DC bias resistance 80 can be integrated on-chip (i.e., on the substrate 18) or off-chip. The DC bias resistance 80 is selected such that the ON state current of the thyristor microresonator 12 is in the low absorbance mode (region A) of FIG. 15. Electrical signals are supplied to the n-channel injector electrode 38 and p-channel injector electrode 40 of the thyristor microresonator 12 for bias purposes. The electrical signal supplied to the n-channel injector electrode 38 includes a DC component that is selected to tune the resonance wavelength of the thyristor microresonator 12 to match the input wavelength of the input optical signal. This can aid in reducing variability of the resonance wavelength that results from the fabrication and growth procedures. A DC differential signal is supplied to the top electrode 58 and the n-channel electrode 62 of the waveguide structure 14. The DC electrical signal controls the device to operate in the coupled state (similar to the coupled state described above in detail with respect to FIG. 14). In this coupled state, the input optical signal that propagates down the waveguide 52 is transferred to the waveguide 44 (in the coupling region of the waveguide 52), where it propagates in a clockwise fashion around the waveguide 44 of the thyristor resonator 12. The electrical signal supplied to the n-channel injector electrode 38 of the thyristor resonator 12 includes a bias current source, and the electrical signal supplied to the p-channel injector terminal 40 of the thyristor resonator 12 includes a bias current sink. The bias current source and the bias current sink provide bias currents that draw majority carriers from the n-type and p-type modulation doped quantum well interfaces to the respective electrodes (i.e., electrons from the n-type modulation doped quantum well interface to the n-channel injector electrode 38, and holes from the p-type modulation doped quantum well interface to the p-channel injector 40). Such bias currents are set such that when the input optical signal is at an ON level, the optical mode propagating in the waveguide 44 has sufficient intensity to produce photocurrent in excess of these bias currents and produces the critical switching charge in either (or both) of the n-type modulation doped quantum well interface and p-type quantum well interface of the thyristor microresonator 12. At this critical switching charge, the thyristor microresonator 12 will switch to its conducting/ON state. In the ON state, the current through the thyristor microresonator 12 introduces a voltage drop across bias resistance 80. When the input optical signal is at the OFF level, the optical mode propagating in the waveguide 44 produces minimal photocurrent and the thyristor microresonator 12 switches to its non-conducting/OFF state because the bias currents drain the respective quantum well interfaces of charge, which causes the channel charge to fall below the holding charge QH. In the OFF state, there is minimal current through the thyristor microresonator 12 and thus there is a minimal voltage drop across the bias resistance 80. In this manner, the electrical signal waveform produced by the differential voltage across the bias resistance 80 represents the ON/OFF levels of the input optical signal. This is the function of the optical detector.

FIG. 20 shows an exemplary configuration of a pair of thyristor microresonators and optically-coupled waveguide structures for an electrically-controlled optical coupler switch. The configuration employs a first thyristor microresonator 12A optically-coupled to a first waveguide structure 14B utilizing evanescent-wave coupling as described above with respect to FIG. 7, and a second thyristor microresonator 12B optically-coupled to a second waveguide structure 14B utilizing evanescent-wave coupling as described above with respect to FIG. 7. All of these structures (first thyristor microresonator 12A, first waveguide structure 14A, second thyristor microresonator 12B, and second waveguide structure 14B) are integrally formed on the common substrate 18. The first and second thyristor microresonators 12A, 12B include parallel waveguide sections that are optically coupled together via evanescent-wave coupling as described above with respect to FIG. 7. An optical signal source (which could be an on-chip or off-chip laser and associated waveguide coupling or other suitable optical element) supplies an optical signal as input to the waveguide 52 of the first waveguide structure 14A. The anode electrodes 44 of the first and second thyristor microresonators 12A, 12B are electrically coupled to a positive DC voltage (labeled $V_{cc}$). A cathode electrode 42 common to both the first and second thyristor microresonators 12A, 12B is electrically coupled to ground potential through DC bias resistance 82. The DC bias resistance 82 can be integrated on-chip (i.e., on the substrate 18) or off-chip. The DC bias resistance 82 is selected such that the ON state currents of the first and second thyristor microresonators 12A, 12B are in the low absorbance mode (region A) of FIG. 15. A DC electrical signal is supplied to the n-channel injector electrodes 38 of the first and second thyristor microresonators 12A, 12B. The DC electrical signal(s) supplied to the n-channel injector electrodes is(are) can be selected to tune the resonance wavelength of the first and second thyristor microresonators 12A, 12B to match the input wavelength of the input optical signal. This can aid in reducing the variability of the resonance wavelength that results from the fabrication and growth procedures. Electrical signals (differential voltage signals) are supplied to the top electrode 58 and the n-channel electrode 62 of the first and second waveguide structures 14A, 14B to control the optical switching operation of the device.

In a first mode (pass-thru mode), the electrical signals (differential voltage signals) supplied to the top electrode 58 and the n-channel electrode 62 of the first waveguide structure 14A controls the coupling between the first waveguide structure 14A and the first thyristor microresonator 12A to operate in the pass-thru state (similar to the pass-thru state described above in detail with respect to FIG. 14). In this pass-thru mode, the input optical signal passes through the waveguide 52 of the first waveguide structure 14A with limited optical loss.

In a second mode (switched mode), the electrical signal (differential voltage signal) supplied to the top electrode 58 and the n-channel electrode 62 of the first waveguide structure 14A controls the coupling between the first waveguide structure 14A and the first thyristor microresonator 12A to operate in the coupled state (similar to the coupled state described above in detail with respect to FIG. 14). In this coupled state, the input optical signal that propagates down the waveguide 52 of the first waveguide structure 14A is transferred via evanescent-wave coupling to the waveguide 44 of the first thyristor microresonator 12A, where it propagates in a clockwise fashion around the waveguide 44 of the first thyristor resonator 12A. The optical signal that propagates clockwise around the waveguide 44 of the first thyristor microresonator 12A is transferred via evanescent-wave coupling as an optical signal that propagates in a counter-clockwise fashion around the waveguide 44 of the second thyristor microresonator 12B. The electrical signal (differential voltage signal) supplied to the top electrode 58 and the n-channel electrode 62 of the second waveguide structure 14B controls the coupling between the second waveguide structure 14B and the second thyristor microresonator 12B to operate in the coupled state (similar to the coupled state described above in detail with respect to FIG. 14). This transfers the optical signal that is propagating counter-clockwise around the waveguide 44 of the second thyristor microresonator 12B to the waveguide 52 of the second waveguide structure 14B. This optical signal propagates down the waveguide 52 of the second waveguide structure 14B for output. In this manner, the input optical signal is selectively output from the two waveguide structures 14A, 14B based on electrical control. Similar operations can be used to switch in the input optical signal supplied to the second waveguide structure 14B for output from the second waveguide structure 14B or the first waveguide structure 14A. This is the function of the electrically-controlled optical coupler switch.

The optical coupler switch of FIG. 20 can be used as a building block for a monolithic optical switching fabric as shown in the exemplary embodiment of FIG. 21. This exemplary switch fabric is a 4×4 switching topology employing six of the optical coupler switches of FIG. 20. In the example shown, the optical coupler switches $S_1$, $S_3$, and $S_5$ are configured in the switched mode while the remainder is configured in the pass-thru mode in order to switch the optical signal from the input port labeled $In_1$ to the output port labeled $Out_4$. In another example shown, the optical coupler switch $S_1$ is configured in the switched-mode while the remainder is configured in the pass-thru mode to switch the optical signal from the input port labeled $In_2$ to the output port labeled $Out_1$. In yet another example shown, the optical coupler switch $S_3$ is configured in the switched-mode while the remainder is off in order to switch the optical signal from the input port labeled $In_3$ to the output port labeled $Out_2$. The signal paths are shown by solid and dashed lines through the switch fabric. An advantage of this topology is that there are no waveguide crossings that introduce optical losses that could limit the scalability of the switching fabric. Moreover, the switch fabric can be arranged for a non-blocking architecture. That is, when a certain pathway between an input port and an output port is established, any other pathway may also be established with the remaining input and output ports, provided that each input is routed to a unique output port.

The optical coupler switch of FIG. 20 can also be used as a building block for a monolithic optical switching fabric that employs wavelength division multiplexing capabilities. In such a configuration, one or more optical coupler switches of FIG. 20 can be coupled in a parallel arrangement sharing common input and output waveguides. Each switch in the parallel arrangement would be tuned to a different resonance frequency, allowing inputs with signals on multiple wavelengths to be routed independently while sharing the input and output waveguides. In an exemplary embodiment shown in FIG. 22, the optical coupler switch pairs $S_0/S_0'$, $S_1/S_1'$, $S_2/S_2'$, $S_3/S_3'$, $S_4/S_4'$, and $S_5/S_5'$ are each configured in a parallel arrangement and tuned to two different resonance frequencies. For a given insertion loss limitation, the switch fabric can be expanded in the wavelength domain to allow for increased aggregate throughput. Similar configurations can be used for an optical add/drop multiplexing function.

The thyristor microresonator offers additional unique advantages for the implementation of the optical switch fabric. One of these advantages is the capability to incorporate a memory function into the switching element. In a large switching fabric (i.e. >50×50), it is difficult from a layout point of view to provide dedicated metal traces to every element. If each element could be switched to the appropriate through or cross state and remain in this state during the data routing cycle, a significant simplification and compaction of the fabric could be realized. This can be accomplished by arranging the thyristor microresonators of the switching fabric to be elements of a memory array. In this configuration, the thyristor microresonators of the switch fabric are adapted to be a memory cell in the manner described below with respective FIGS. 23 to 31. The data stored in each thyristor-based memory cell corresponds to the required settings for input optical data to be routed to the desired output port. The data is stored in the respective thyristor memory cell during the write cycle where the state of each memory location is determined by electrical inputs to the thyristor device. However as FIG. 15 shows, the writing may also be accomplished with a combination of electrical and optical inputs. This allows the opportunity for the state of the memory to be written with optical injection in the x (waveguide) direction and electrical injection in the y (normal to waveguide) direction. Then the data in the optical label can be used to set the state of the switch. The state of the entire memory (i.e. switching fabric) can be erased using the electrical inputs for all the thyristor memory cells. The thyristor memory cell will retain their data if each element has a dedicated load resistor and this is accomplished by using a vertical resistor construction during the fabrication. Finally, the state of the memory (once written) can be retained in the power down mode (with a power of <1 nW per element) for periods in excess of a few milliseconds. This allows for very low power operation of the switching fabric.

In all of the configurations described herein, the resonance frequency of the thyristor microresonator element can vary based on variations in geometry and refractive index occurring during growth and fabrication. A calibration method can be used to ensure that the resonance frequency of the thyristor microresonator element matches the desired wavelength of the signal that it is intended to process. The thyristor microresonator offers a unique opportunity to perform this calibration which can be explained with the help of FIG. 15. The choice of resistor determines the ON state current flow through the thyristor and corresponding charge densities in the quantum wells. The charge densities control the effective refractive index of the thyristor waveguide and thus indirectly the resonant frequency of each switch in the fabric. Thus a calibration procedure may be implemented whereby the load resistor is adjusted and then locked in to an appropriate value according to the desired resonance frequency of the thyristor microresonator in its on-state.

In yet another embodiment of the present invention, the thyristor resonator 12 can be adapted to generate and emit light vertically from an aperture defined in a central region of the device inside the closed loop microresonator waveguide 44. The aperture can be defined by etching away or otherwise patterning the top anode layer 30 such that light can propagate from (or propagate into) the central region of the device inside the closed loop microresonator waveguide 44. In this case, the implants 48a and 48b can be patterned to form under the top anode layer 30 but not under the aperture within the central region of the device. This adaptation can be used for the optical detector configuration to emit an optical signal that corresponds to the ON/OFF levels of the input optical signal. It is also contemplated that optical control signals can be introduced vertically into the aperture defined in the central region of the device. Such optical control signals can control the ON/OFF state of the thyristor resonator 12 and/or change the charge density of the n-type modulation doped quantum well interface of the thyristor resonator 12 for optically controlled modulation and coupling control. In these configurations, the vertical dimension of the thyristor resonator 12 can be tuned to the particular wavelength of an optical mode that is emitted or received vertically from the device. More specifically, the vertical dimension of the thyristor resonator is selected to conform to the following:

$$D = \frac{2\pi m\lambda}{n_{eff}}, \quad (10)$$

where D is the vertical dimension of the thyristor resonator;
m is an integer greater than zero;
λ is the wavelength of the optical mode that is to be emitted from or received by the device; and
$n_{eff}$ is the effective refractive index of the device.

Note that the thyristor microresonator can be configured so that the light is guided around the waveguide 44, while simultaneously emitting (and detecting) light vertically. Then the operation is available that an input optical signal may enter the microresonator coupling waveguide and switch on the thyristor microresonator so that the vertical operation projects light upwards. This is the operation of an on-chip optical signal launching an off chip vertical optical signal. Likewise the vertically propagating optical signal may enter the aperture of a microresonator on another chip. Then that microresonator may be switched on and launch light into the coupling waveguide on its chip. The combination may provide the basis for chip to chip coupling based on optics. Today, the industry is moving in this direction of creating stacked three-dimensional architectures using electrical vias. This combination can be used to replace such electrical vias with optical connections at much lower cost, higher speed and lower power.

Figure 23:
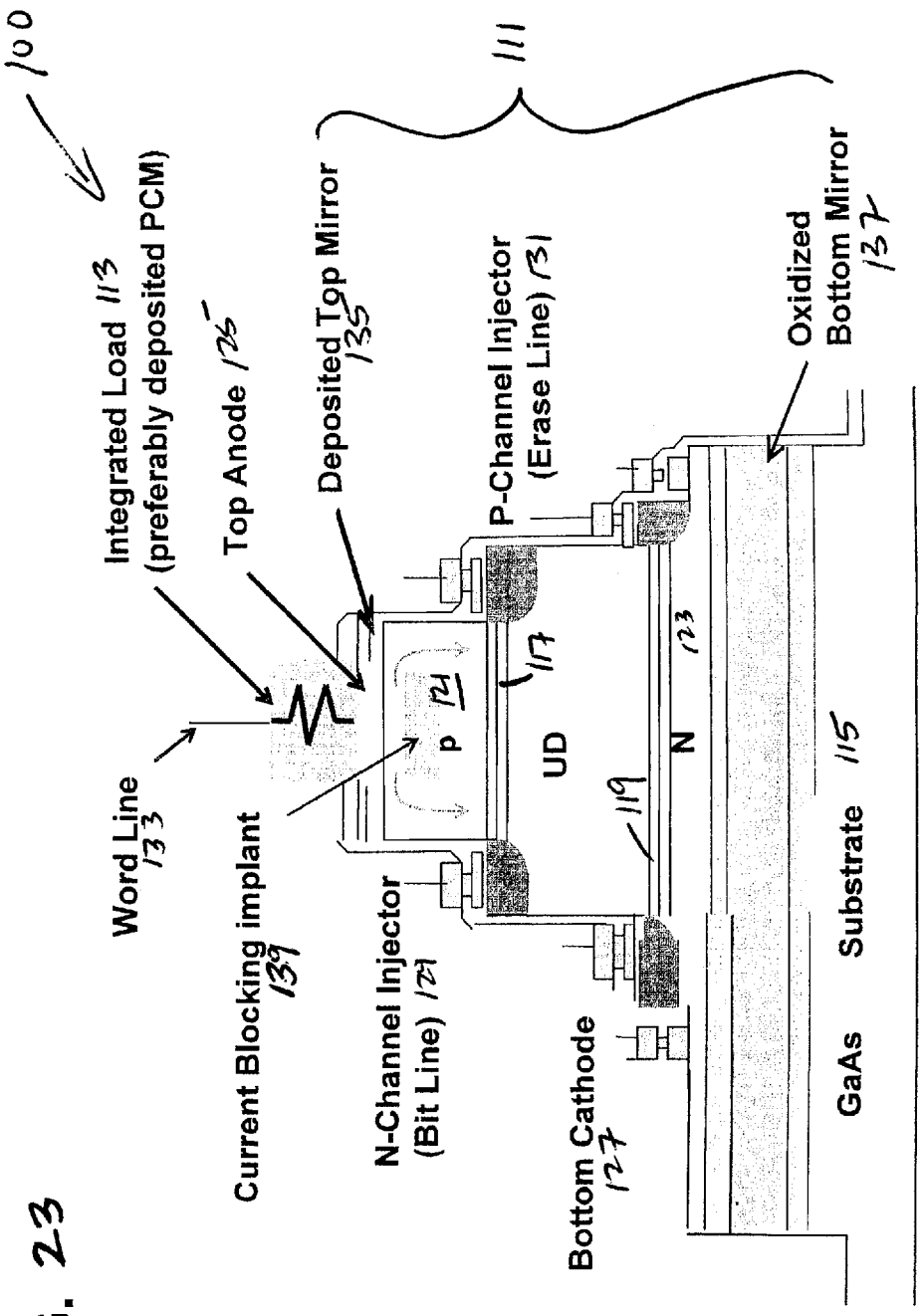
FIG. 23 is a schematic diagram of a thyristor memory cell according to the present invention.

In other aspect of the invention, a thyristor memory cell is provided as shown in FIG. 23. The thyristor memory cell 100 includes two devices (a thyristor device 111 and a resistive load element 113) integrally formed on a substrate 115. The thyristor device 111 includes complementary n-type and p-type modulation doped quantum well interfaces 117, 119 formed between P+ layer(s) 121 and N+ layer(s) 123. In the preferred embodiment, the thyristor device 111 is defined by a mesa that includes a refractory anode terminal 125 formed adjacent the highly doped top P+ layer 121. A cathode terminal 127 is operably coupled to a bottom N+ layer 123. The potential of the cathode terminal 127 is fixed at ground (or a negative potential). An n-channel injector terminal 129 and a p-channel injector terminal 131 are operably coupled to the n-type and p-type modulation doped quantum well interfaces, respectively. The resistive load element 113 is integrally formed on the anode terminal 125. In the preferred embodiment, the load element 113 is realized by a phase change material sandwiched between the refractory anode metal 125 and a top refractory electrode. The top refractory electrode (which can be realized from tungsten or other suitable metal) is electrically connected to a word line 133 (which can be realized from copper or other suitable metal). The resistance of the phase change material can be changed between a high resistance phase and a low resistance phase (or vice-versa) in response to electrical signals supplied to the two electrodes that sandwich the phase change material. The phase change material can be a chalcogenide glass material that is capable of changing phase between a high resistance amorphous phase and a low resistance crystalline phase (and vice versa) by Joule heating of the material through application of current to the material. This operation allows the thyristor cell 100 to function as a non-volatile memory cell. It can also function as a static memory cell that does not require periodic refresh, or as a dynamic memory cell that does require periodic refresh as described below.

For optical operations, the thyristor device 111 is formed in a resonant cavity defined by a bottom DBR mirror 135 and top DBR mirror 137. The bottom DBR mirror 137 is preferably formed by selective oxidation of semiconductor layers that underlie the bottom N+ layer 123 of the thyristor device 111, and the top DBR mirror 135 is preferably formed by deposition of dielectric materials above the refractory metal anode 125 of the thyristor device 111. A diffraction grating (not shown) can be used to direct light propagating laterally (in plane light) into a vertical mode confined by the bottom and top DBR mirrors. A current blocking implant 139 can be used to steer current into localized regions of the n-channel quantum well interface 117 of the device 111 in order to increase the current density to induce lasing conditions as desired.

The thyristor device 111 switches from a non-conducting/OFF state (where the current I through the device is substantially zero) to a conducting/ON state (where current I is substantially greater than zero) when:

i) the anode terminal 125 is forward biased (e.g. biased positively) with respect to the cathode terminal 127; and ii) the voltage between n-channel injector electrode 129 and the anode electrode 125 is forward biased for a period long enough to produce a charge in the n-type modulation doped quantum well interface 117 that is greater than the critical switching charge QCR, which is that charge that reduces the forward breakdown voltage such that no off state bias point exists.

The voltage between p-channel injector electrode 131 and the cathode electrode 127 can also be configured to produce a charge in the p-type modulation doped quantum well interface 119 that is greater than the critical switching charge QCR, which is that charge that reduces the forward breakdown voltage such that no off state bias point exists.

The critical switching charge QCR is unique to the geometries and doping levels of the device. The thyristor device 111 switches from the conducting/ON state (where the current I is substantially greater than zero) to a non-conducting/OFF state (where current I is substantially zero) when the current I through device falls below the hold current of the device for a sufficient period of time such that the charge in the n-type modulation doped quantum well interface 117 (or the charge in the p-type modulation doped quantum well interface 119) decreases below the holding charge QH, which is the critical value of the channel charge which will sustain holding action.

As an optoelectronic component, the thyristor device 111 is multifunctional. If the anode terminal 125 is forward biased (e.g. biased positively) with respect to the cathode terminal 127 and the n-channel injector terminal 129 (and/or the p-channel injector terminal 131) is biased to produce the critical switching charge QCR in the n-type modulation doped quantum well interface 117 (or in the p-type modulation doped quantum well interface 119), then the thyristor device 111 will switch to its conducting/ON state. If the current I in the conducting/ON state is above the threshold for lasing, then laser emission will occur. This is the operation of a semiconductor laser. If the thyristor device 111 is in the non-conducting/OFF state and light is admitted into the cavity, then the device 111 can function as an optical detector in the sense that when sufficient electron-hole pairs have been generated to produce the critical switching charge QCR in the n-type modulation doped quantum well interface 117 (or in the p-type modulation doped quantum well interface 119), the thyristor device 111 will switch to its ON state.

The conducting/ON state and the non-conducting/OFF state of the thyristor device 111 of the memory cell stores "1" and "0" bit values, respectively. In the conducting/ON state of the thyristor device ("1" bit value), current flows through the resistive load element 113 into the anode terminal 125 and through the device, which causes a positive voltage difference between the n-channel injector terminal 129 (bit line) and the cathode terminal 127 (ground or negative potential). In the non-conducting/OFF state of the thyristor device ("0" bit value), current does not flow through the resistance load element 113 into the anode terminal 125 and through the device, thus providing minimal voltage difference between the between the re-channel injector terminal 129 (bit line) and the cathode terminal 127 (ground or negative potential).

For electrical read operations, the voltage signal of the n-channel injector terminal 129 (the bit line) represents the bit value of the cell 100. For optical read operations, the thyristor device 111 can be configured to emit light in its conducting/ON state (ON current in conducting state greater than the threshold lasing current of the device), and not emit light in its non-conducting/OFF state.

The thyristor device 111 can be programmed electrically into the conducting/ON state ("1" bit value) by applying a forward bias (e.g. biased positively) between the anode terminal 125 and the cathode terminal 127 while forward biasing the n-channel injector electrode 129 with respect the anode electrode 125 for a period long enough to produce a charge in the n-type modulation doped quantum well interface 117 that is greater than the critical switching charge QC. The thyristor device 111 can also be programmed optically into the conducting/ON state ("1" bit value) by applying a forward bias (e.g. biased positively) between the anode terminal 125 and the cathode terminal 127 while supplying an optical pulse of sufficient intensity and/or duration into the resonant cavity of the device to produce a charge in the n-type modulation doped quantum well interface 117 that is greater than the critical switching charge QC. The thyristor device 111 can be programmed electrically into the non-conducting/OFF state ("0" bit value) by applying the appropriate voltage levels at the n-channel injector terminal 129 (bit line) and the p-channel injector terminal 131 (erase line) such that the charge in the n-type modulation doped quantum well interface 117 decreases below the holding charge QH.

For non-volatile write applications, the resistive load element 113 can be programmed into a high resistance state such that thyristor device 111 operates in the non-conducting/OFF state ("0" bit value) in a non-volatile manner by applying suitable voltage levels to the word line 133 and the n-channel injector terminal 129 of the device in order to produce a melting of the phase change material of the resistive load element 113, which causes a change to an amorphous/highly resistive state. The resistive load element 113 can be programmed into a low resistance state such that thyristor device 111 operates in the conducting/ON state ("1" bit value) in a non-volatile manner by applying suitable voltage levels to the word line 133 and the n-channel injector terminal 129 of the device in order to produce current that recrystallizes the phase change material into its crystalline low resistance state.

The reading, writing and non-volatile programming operations of the thyristor memory cell 100 are summarized in FIG. 24.

Figure 25:
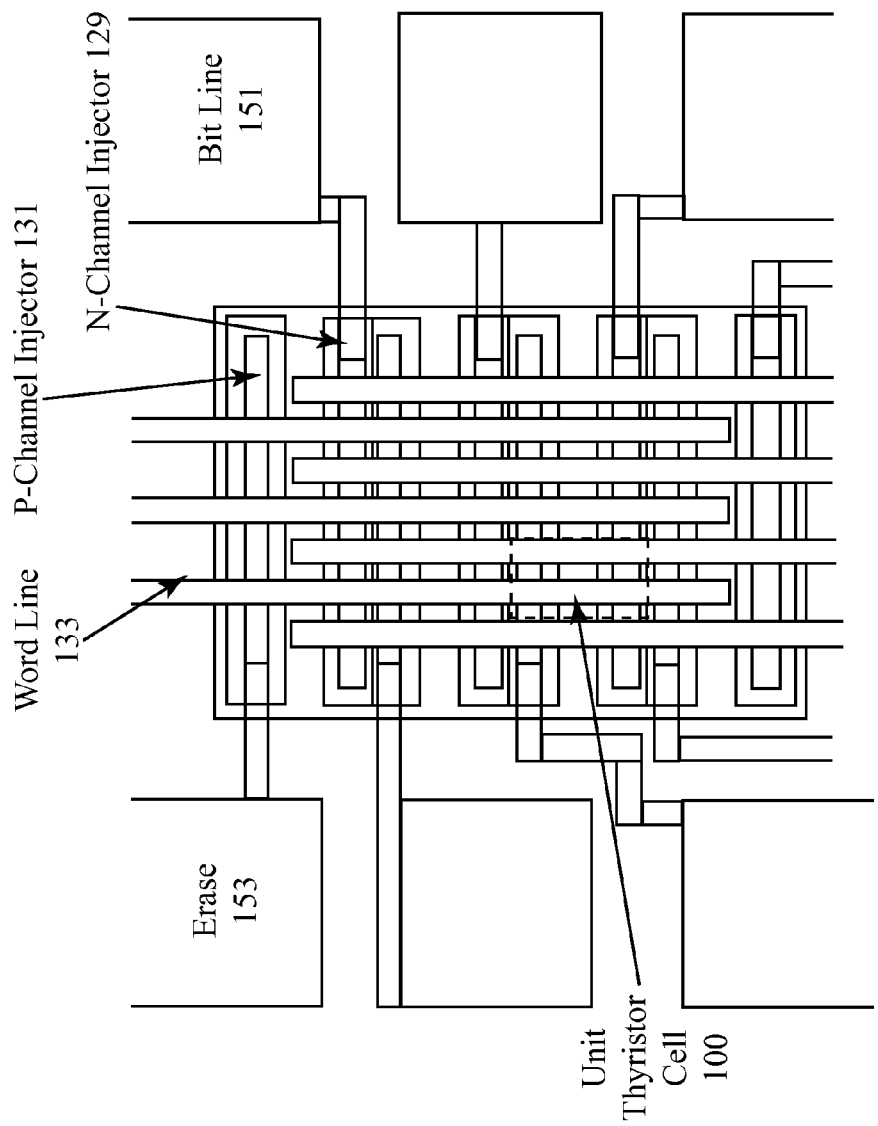
FIG. 25 is a schematic view of an array of thyristor memory cells of FIG. 23 integrated on a common substrate.

FIG. 25 shows a schematic diagram of an exemplary array of thyristor memory cells 100. The n-channel injector 129 and the p-channel injector 131 for each row of cells are connected to a bit line 151 and erase line 153, respectively, for the row. The word line 133 for each column of cells is connected to the top electrode of the load resistors 113 for the cells of the column.

Preferably, the thyristor memory cell 100 of the present invention (and possibly other optoelectronic devices, logic circuits and/or signal processing circuits that are fabricated integral thereto) are realized from the inversion quantum-well channel device structures similar to those described in detail in U.S. Pat. No. 6,031,243; U.S. patent application Ser. No. 09/556,285, filed on Apr. 24, 2000; U.S. patent application Ser. No. 09/798,316, filed on Mar. 2, 2001; International Application No. PCT/US02/06802 filed on Mar. 4, 2002; U.S. patent application Ser. No. 08/949,504, filed on Oct. 14, 1997, U.S. patent application Ser. No. 10/200,967, filed on Jul. 23, 2002; U.S. application Ser. No. 09/710,217, filed on Nov. 10, 2000; U.S. Patent Application No. 60/376,238, filed on Apr. 26, 2002; U.S. patent application Ser. No. 10/323,390, filed on Dec. 19, 2002; U.S. patent application Ser. No. 10/280,892, filed on Oct. 25, 2002; U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002; U.S. patent application Ser. No. 10/323,388, filed on Dec. 19, 2002; U.S. patent application Ser. No. 10/340,942, filed on Jan. 13, 2003; all of which are hereby incorporated by reference in their entireties. With these structures, a fabrication sequence is used to make all the devices, including an array of thyristor memory cells and supporting electrical and/or optoelectronic devices on a common substrate. In other words, n type and p type contacts, critical etches, etc. are used to realize all of these devices simultaneously on a common substrate. The essential features of this device structure include 1) an n-type modulation doped interface and a p-type modulation doped quantum well interface, 2) self-aligned n-type and p-type channel contacts formed by ion implantation, 3) n-type metal contacts to the n-type ion implants and the bottom n-type layer structure, and 4) p-type metal contacts to the p-type ion implants and the top p-type layer structure. The active device structures are preferably realized with a material system of group III-V Materials (Such as a GaAs/AlGaAs).

Figure 26:
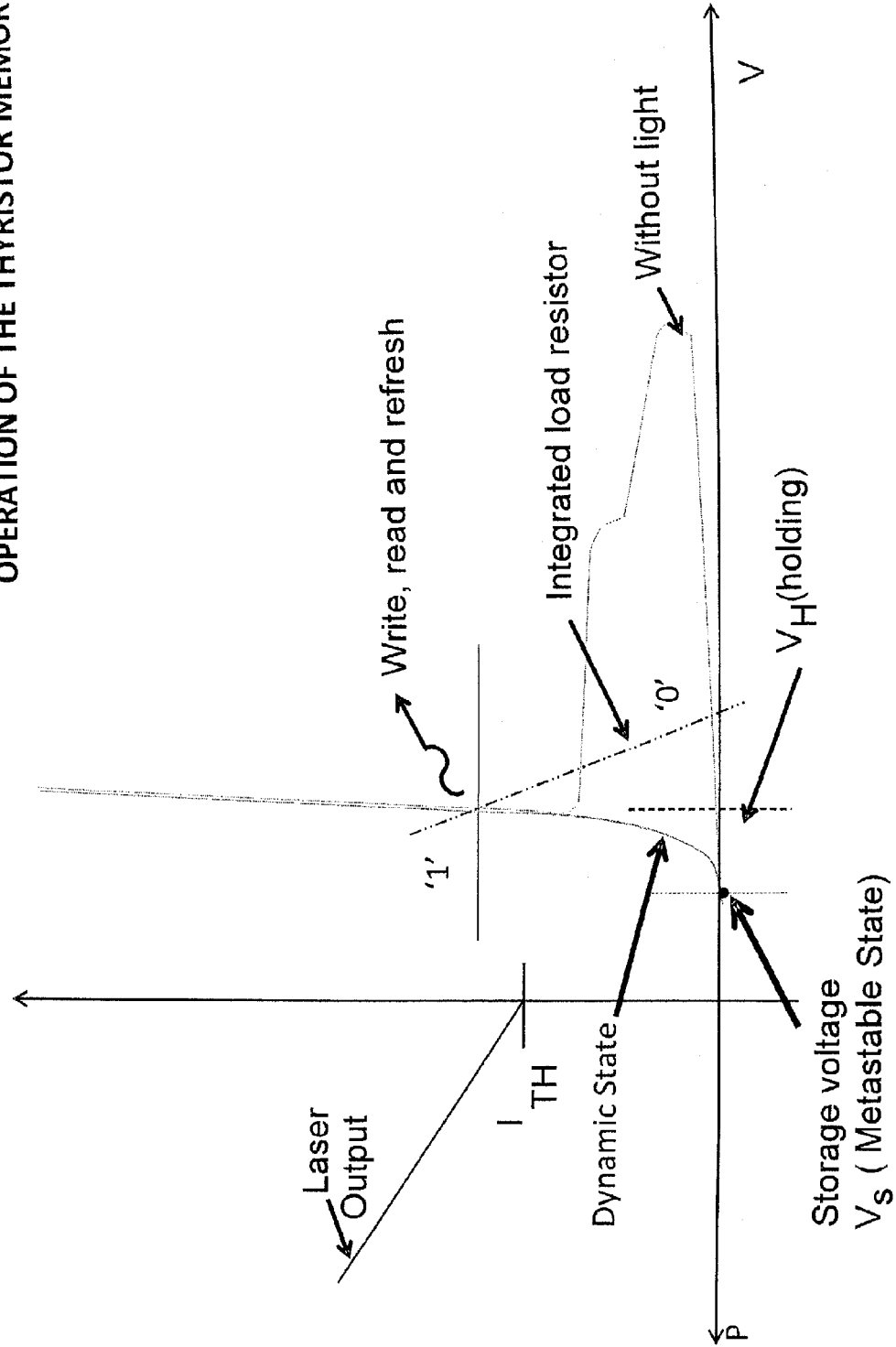
FIG. 26 is an exemplary IV curve illustrating the operations of the thyristor memory cell of FIG. 23.

FIG. 26 shows the IV characteristic of a thyristor memory cell 100 according to the present invention. The thyristor has the non-conducting/OFF and the conducting/ON states to store a '0' and '1' respectively. With the thyristor operated this way it has the function of a flip flop. Therefore, it is an ideal static RAM (SRAM) cell. The cell has two devices (a thyristor and a load) compared to the flip flop (6T cell). Therefore smaller footprint and higher speed. As described above, the n-channel injector terminal is used to write a '1', and the n-channel injector terminal and the p-channel injector terminal are used to write a '0'. In the preferred embodiment, the operations involve writing a "0" globally (clearing all of the thyristor memory cells), and then writing the "1" values to the appropriate cells of the array one column at a time. Read operations can be performed on the thyristor memory cells as required. During the time between a write and read operation, a forward bias (e.g. biased positively) is applied between the anode terminal and the cathode terminal of the thyristor device, and the latching behavior of the thyristor memory cell stores the bit value of the cell. The resistive load element is a thin film resistor integrated onto the top metal contact of the thyristor device. Therefore the footprint of the memory cell is the crosspoint of an array, i.e. the intersection of two minimum line features. This provides for high density.

In the preferred embodiment, the integrated resistive load 113 is realized from a phase change material as described above. This combines two memory functions within a single cell—one memory function from the load resistor, and another memory function from the latching behavior of the thyristor device. This allows the memory cell 100 to function as a static memory cell (SRAM) as well as a non-volatile memory cell. For normal SRAM operation, the load resistor 113 is programmed into its low resistance state and the thyristor memory cell 100 operates as shown in FIG. 27. For non-volatile applications, the load resistor 113 can be programmed into the "0" or "1" bit values as described above, and the thyristor memory cell 100 operates as shown in FIG. 28. In the preferred embodiment, the operations involve writing a "0" globally to the load resistors of the array (clearing all of the thyristor memory cells), and then writing the "1" values to the load resistors 113 of the array one column at a time. Read operations can be performed on the thyristor memory cells 100 as required. During the time between a write and read operation, the supply of bias signals to the thyristor device 111 can be removed, and the no-volatile nature of the resistive load 113 stores the bit value of the cell 100.

The configurable nature of the thyristor memory cell 100 as a static memory cell or a non-volatile memory cell has many advantages, including:
  The same footprint of memory cell is used.
  For all high speed functions, the SRAM operation is utilized.
  NV operation is only necessary for a sudden loss of power. Therefore there is no point is sacrificing speed to use NV '1's and '0's for all memory operations because the NV operations are somewhat slower than the SRAM's. Instead the NV operation is reserved only for those situations when it is required to protect from power loss.
Therefore the kind of operation envisioned is one where the loss of power is monitored by on chip sense circuits. These circuits can operate with ns speeds and can detect power supply changes on microsecond time scales. Therefore the circuits continuously monitor the power supply. If a loss of power is predicted, then before there is a complete voltage drop, the NV writing mechanism kicks in and the state of the memory is captured. Then when power is resumed, the memory state is rewritten back to the SRAM mode and the operation continues. Thus NV operation is utilized only when required and the only overhead penalties are the power failure detect circuits and the NV write circuits.

The thyristor memory cell 100 can also operate a DRAM cell as shown in FIG. 29. The states are the same as the SRAM of FIG. 27 but there is an additional state called the 'store' state. Thus, after writing either a '1' or a '0', and during the time that a read operation is not required (these represent substantial periods of time when neither writing nor reading are necessary), the cell 100 is powered down to a low voltage (e.g., approximately 0.6V). The charge in the modulation doped quantum well interfaces 117, 119 cannot escape by conduction because the components have been reduced drastically. Also recombination is essentially zero. Therefore, if a '1' is stored, i.e. the modulation doped quantum well interfaces 117, 119 of the thyristor device 111 are filled with charge, then they will remain filled for a long time. Simulations have shown that when the voltage is raised back to the SRAM '1' state after 1 sec, there is still enough charge left in the cell, to restore the ON state. That means the data has not been lost. If the store time exceeds some long time, say 2 seconds, then sufficient charge leaks away that a '0' will be obtained upon increasing the voltage. So a refresh operation is required periodically (e.g., once every sec) as shown in FIG. 30. The advantage gained is ultra-low power. The speed of read and write is identical to the SRAM. Clearly this DRAM has significant advantages which are:
  High speed operation, similar to SRAM cell.
  Selective operation of the cell as an SRAM cell or DRAM cell can be controlled by simply disabling the refresh cycle and the store voltage.
  The NV backup mode of operation is available here as well.
  Extremely low power operation is possible.
  Extremely high density as shown by the array layout (same as SRAM, NVRAM)
  No complex sense amps are required. The active of the thyristor device 111 is its own sense amp.
  Not limited by stored charge as in conventional DRAM. The thyristor device is an active device which can supply current instead of charge-active read.
  Finally, the DRAM, SRAM and NVRAM, have a photonic capability as well due to the optical writing and reading function capabilities of the device.

This allows a linear array of thyristor memory elements 100 to be coupled to a single waveguide in order to detect and store bits of the optical signal carried by the waveguide. This is a perfect solution for the problem of optical data switching at the front of an optical router. These are photonic buffers. They can hold a frame of data (packet of bits) for several data cycles and then can be controlled to retransmit the data onto the network.

The advantages of the thyristor memory cell 100 of the present invention are summarized in FIG. 31.

There have been described and illustrated herein several embodiments of optoelectronic thyristor microresonator devices and systems based thereon as well as several embodiments of optoelectronic thyristor memory cell devices and systems based thereon. While particular embodiments of the invention have been described, it is not intended that the invention be limited thereto, as it is intended that the invention be as broad in scope as the art will allow and that the specification be read likewise. Moreover, while particular configurations have been disclosed in reference to particular thyristor microresonator devices and systems based thereon, it will be appreciated that other configurations could be used as well. Particularly, different quantum well active device structures can be used. For example, other active device structure with one or more modulation doped quantum well interfaces (e.g., a single n-type or p-type modulation doped quantum well interface) can be used. It will therefore be appreciated by those skilled in the art that yet other modifications could be made to the provided invention without deviating from its spirit and scope as claimed.

It is the express intention of the applicant not to invoke 35 U.S.C. §112, paragraph 6 for any limitations of any of the claims herein, except for those in which the claim expressly uses the word 'means' together with an associated function.

What is claimed is:

1. A semiconductor device comprising:
    an optical resonator for processing light at a predetermined wavelength, the optical resonator including a closed loop waveguide and a central region surrounded by the closed loop waveguide; and
    a waveguide structure spaced from the closed loop waveguide of the optical resonator to provide for evanescent-wave optical coupling therebetween;
    wherein both the optical resonator and the waveguide structure are formed in an epitaxial layer structure deposited on a substrate, the epitaxial layer structure including at least one modulation doped quantum well interface; and
    wherein the central region of the optical resonator includes a first electrode with at least one ion implant region formed under the first electrode and extending through the at least one modulation doped quantum well interface of the epitaxial layer structure adjacent the closed loop waveguide, wherein the at least one ion implant region provides for lateral confinement of light within the closed loop waveguide and for funneling of current from the first electrode away from the central region and through the closed loop waveguide of the optical resonator.

2. A semiconductor device according to claim 1, wherein: the optical resonator further includes a second electrode that cooperates with the first electrode to provide for DC current that flows through the closed loop waveguide, and the at least one ion implant region provides for funneling of said DC current away from the central region and through the closed loop waveguide of the optical resonator.

3. A semiconductor device according to claim 2, wherein: charge density in the at least one modulation doped quantum well interface of the epitaxial layer structure of the closed loop waveguide controls the refractive index of the closed loop waveguide, wherein said DC current that flows through the closed loop waveguide of the optical resonator affects the charge density in the at least one modulation doped quantum well interface of the epitaxial layer structure of the closed loop waveguide and the refractive index of the closed loop waveguide.

4. A semiconductor device according to claim 2, further comprising:
    a third electrode electrically coupled to the modulation doped quantum well interface of the epitaxial layer structure of the closed loop waveguide.

5. A semiconductor device according to claim 4, wherein:
    a time-varying electrical signal is supplied to the third electrode to vary charge density in the at least one modulation doped quantum well interface of the epitaxial layer structure of the closed loop waveguide in order to change the refractive index of the closed loop waveguide and modulate the evanescent-wave coupling between the closed loop waveguide and the waveguide structure.

6. A semiconductor device according to claim 4, wherein:
    a DC electrical signal is supplied to the third electrode to control charge density in the at least one modulation doped quantum well interface of the epitaxial layer structure of the closed loop waveguide in order to control the refractive index of the closed loop waveguide.

7. A semiconductor device according to claim 1, wherein: for at least one straight section of the waveguide structure that is optically coupled to one section of the closed loop waveguide, at least one additional ion implant region is formed such that it extends through the at least one modulation doped quantum well interface of the epitaxial layer structure of the waveguide structure, wherein the at least one additional ion implant region provides for lateral confinement of light with the waveguide structure.

8. A semiconductor device according to claim 1, wherein: the waveguide structure includes fourth and fifth electrodes that provide for current flow through the at least one modulation doped quantum well interface of the epitaxial layer structure of the waveguide structure.

9. A semiconductor device according to claim 8, wherein:
    a time-varying electrical signal is supplied to the fourth and fifth electrodes to vary charge density in the at least one modulation doped quantum well interface of the epitaxial layer structure of the waveguide structure in order to change the refractive index of the waveguide structure and modulate the evanescent-wave coupling between the closed loop waveguide and the waveguide structure.

10. A semiconductor device according to claim 1, wherein: the closed loop waveguide is rectangular in nature with four straight sections coupled by ninety degree bends.

11. A semiconductor device according to claim 10, wherein:
    each ninety degree bend includes an outside facet and a cut inside corner that extends parallel to the outside facet, wherein the outside facet is defined a sidewall in the epitaxial layer structure and the cut inside corner is defined by the profile of the at least one ion implant.

12. A semiconductor device according to claim 10, wherein:
    the waveguide structure has a zig-zag path with five straight sections coupled by ninety degree bends.

13. A semiconductor device according to claim 1, further comprising:
    a plurality of distributed bragg reflector (DBR) mirror layers formed on the substrate below the at least one modulation doped quantum well interface of the epitaxial layer structure of the optical resonator and the waveguide structure.

14. A semiconductor device according to claim 13, further comprising:
    a plurality of dielectric mirror layers formed on the substrate above the epitaxial layer structure of the optical resonator and the waveguide structure.

15. A semiconductor device according to claim 1, wherein:
    said epitaxial layer structure includes an N+ type doped layer, a first plurality of layers that define a p-type modulation doped quantum well interface formed above said N+ type doped layer, a second plurality of layers that define an n-type modulation doped quantum well interface formed above said first plurality of layers, and a P+ type doped layer spaced from said second plurality of layers.

16. A semiconductor device according to claim 15, wherein the optical resonator is formed by:
    a top p-type metal layer which contacts the P+ type doped layer; and
    N+ type ion implanted regions which contact the n-type modulation doped quantum well interface;

an n-type metal layer that contacts the N+ type ion implanted regions; and a bottom n-type metal layer that contacts the N+ type doped layer;

wherein the optical resonator realizes a thyristor in which said top p-type metal layer is the first (anode) electrode of the thyristor, said bottom n-type metal layer is the cathode electrode of the thyristor, and the n-type metal layer that contacts the n-type modulation doped quantum well interface is an injector terminal of the thyristor.

17. A semiconductor device according to claim 16, wherein:

the anode and cathode electrodes provide for DC current that flows through the closed loop waveguide, and the at least one ion implant region provides for funneling of said DC current away from the central region and through the closed loop waveguide of the optical resonator.

18. A semiconductor device according to claim 17, wherein:

said DC current that flows through the closed loop waveguide of the optical resonator affects charge density in the at least one modulation doped quantum well interface of the epitaxial layer structure of the closed loop waveguide and the refractive index of the closed loop waveguide.

19. A semiconductor device according to claim 16, wherein:

a time-varying electrical signal is supplied to the injector terminal to vary charge density in the n-type modulation doped quantum well interface of the epitaxial layer structure of the closed loop waveguide in order to change the refractive index of the closed loop waveguide and modulate the evanescent-wave coupling between the closed loop waveguide and the waveguide structure.

20. A semiconductor device according to claim 16, wherein:

a DC electrical signal is supplied to the injector terminal to control charge density in the n-type modulation doped quantum well interface of the epitaxial layer structure of the closed loop waveguide in order to control the refractive index of the closed loop waveguide.

21. A semiconductor device according to claim 20, wherein:

the waveguide structure includes fourth and fifth electrodes that provide for current flow through an n-type modulation doped quantum well interface of the epitaxial layer structure of the waveguide structure; and a time-varying electrical signal is supplied to the fourth and fifth electrodes to vary charge density in the n-type modulation doped quantum well interface of the epitaxial layer structure of the waveguide structure in order to change the refractive index of the waveguide structure and modulate the evanescent-wave coupling between the closed loop waveguide and the waveguide structure.

22. A semiconductor device according to claim 1, further comprising:

at least one additional ion implant region that extends through the at least one modulation doped quantum well interface of the epitaxial layer structure for a gap region between the closed loop waveguide and the waveguide structure.

23. A semiconductor device according to claim 1, wherein:

the optical resonator is configured to operate as an optical modulator that modulates a continuous-wave optical signal supplied to the input of the waveguide structure in order to produce a modulated optical signal at the output of the waveguide structure.

24. A semiconductor device according to claim 1, wherein:

the optical resonator is configured to operate an in-plane laser that produces an optical signal that is transferred to the waveguide structure and emitted from the output of the waveguide structure.

25. A semiconductor device according to claim 24, wherein:

electrical signals are applied to the device to modulate the evanescent-wave coupling between the closed loop waveguide and the waveguide structure in order to modulate the optical signal produced at the output of the waveguide structure.

26. A semiconductor device according to claim 1, wherein:

the optical resonator is configured as a detector that produces an output signal corresponding to ON/OFF levels of an input optical signal supplied to the input of the waveguide structure.

27. A semiconductor device according to claim 1, wherein:

the optical resonator is configured as a vertical cavity surface emitting laser (VCSEL) whereby current flow in the on state exceeds a laser threshold for producing light emission from an optical aperture.

28. A semiconductor device according to claim 1, wherein:

the optical resonator and the waveguide structure comprise a first device pair;

an additional optical resonator and an additional waveguide structure formed on the substrate comprise a second device pair;

the optical resonators of the first and second device pairs are optically coupled to one another by evanescent-wave coupling; and the device is configured as an optical switch for selectively transferring an input optical signal supplied to the input of one of the first and second waveguide structures to the output of one of the first and second waveguide structures.

29. An optical switch fabric comprising:

an array of the semiconductor devices of claim 28 integrally formed on the substrate.

30. An optical switch fabric of claim 29, wherein:

the optical resonators of the array are adapted to switch different wavelength signals in order to support switching of wavelength division multiplexed optical signals input to the optical switch fabric.

31. A semiconductor device according to claim 1, wherein:

length of the closed loop waveguide corresponds to the particular wavelength of light.

32. A semiconductor device according to claim 1, wherein:

the at least one modulation doped quantum well interface of the epitaxial layer structure includes an n-type modulation doped quantum well interface offset vertically from a p-type modulation doped quantum well interface; and the at least one ion implant formed under the first electrode includes a first ion implant region offset vertically from a second ion implant region, where the first ion implant region extends through the n-type modulation doped quantum well interface of the epitaxial layer structure adjacent the closed loop waveguide, and wherein the second ion implant region extends through the p-type modulation doped quantum well interface of the epitaxial layer structure adjacent the closed loop waveguide.

* * * * *